United States Patent
Lo et al.

(10) Patent No.: US 11,670,731 B2
(45) Date of Patent: Jun. 6, 2023

(54) SYSTEMS, DEVICES AND METHODS FOR AMPLIFICATION OF SIGNALS BASED ON A CYCLING EXCITATION PROCESS IN DISORDERED MATERIALS

(71) Applicant: The Regents of the University of California, Oakland, CA (US)

(72) Inventors: Yu-Hwa Lo, San Diego, CA (US); David Hall, San Diego, CA (US); Yu-Hsin Liu, San Diego, CA (US); Zihan Xu, La Jolla, CA (US); Lujiang Yan, La Jolla, CA (US)

(73) Assignee: The Regents of the Unversity of California, Oakland, CA (US)

( * ) Notice: Subject to any disclaimer, the term of this patent is extended or adjusted under 35 U.S.C. 154(b) by 0 days.

(21) Appl. No.: 16/486,482

(22) PCT Filed: Feb. 13, 2018

(86) PCT No.: PCT/US2018/018076
§ 371 (c)(1),
(2) Date: Aug. 15, 2019

(87) PCT Pub. No.: WO2018/152135
PCT Pub. Date: Aug. 23, 2018

(65) Prior Publication Data
US 2019/0363213 A1   Nov. 28, 2019

Related U.S. Application Data

(60) Provisional application No. 62/459,766, filed on Feb. 16, 2017.

(51) Int. Cl.
*H01L 31/107*   (2006.01)
*H01L 31/0376*  (2006.01)
(Continued)

(52) U.S. Cl.
CPC ...... *H01L 31/1075* (2013.01); *H01L 31/0376* (2013.01); *H01L 31/03762* (2013.01);
(Continued)

(58) Field of Classification Search
CPC ............... H01L 31/107; H01L 31/0376; H01L 31/1075; H01L 31/03762; H01L 31/03765; H01L 51/4213
(Continued)

(56) References Cited

U.S. PATENT DOCUMENTS 4,523,214 A * 6/1985 Hirose ................ H01L 31/1055
257/443
4,811,069 A * 3/1989 Kakinuma ........ H01L 27/14665
257/443
(Continued)

FOREIGN PATENT DOCUMENTS

CN   104795499   *   7/2015
CN   107185558   *   9/2017

OTHER PUBLICATIONS

Agrawal, G. P. Fiber-Optic Communication Systems Ch. 4 (John Wiley & Sons, Inc., Hoboken, New Jersey, 2010). 66 pages.
(Continued)

*Primary Examiner* — Sheng-Bai Zhu
(74) *Attorney, Agent, or Firm* — Perkins Coie LLP

(57) ABSTRACT

Methods, systems, and devices are disclosed for low noise and high efficiency photoelectric amplification based on cycling excitation process (CEP). In some aspects, a device for amplifying signals of light-induced photocurrent includes an anode connected to a positive terminal of a voltage source; a disordered material layer coupled to the anode, wherein the disordered material layer is structured to have a thickness of 100 nm or less; and a cathode coupled to the disordered material layer and connected to a negative
(Continued)

terminal of the voltage source, in which the device is operable to amplify photoexcited carriers based on photon absorption to produce an external quantum efficiency of the device that is at least 100%.

29 Claims, 20 Drawing Sheets

(51) Int. Cl.
   *H10K 30/10*       (2023.01)
   *H01L 31/0256*     (2006.01)
   *H01L 51/42*       (2006.01)

(52) U.S. Cl.
   CPC .... *H01L 31/03765* (2013.01); *H01L 51/4213* (2013.01); *H01L 2031/0344* (2013.01)

(58) Field of Classification Search
   USPC .......................................................... 257/40
   See application file for complete search history.

(56) References Cited

U.S. PATENT DOCUMENTS

| | | | |
|---|---|---|---|
| 5,670,791 | A | 9/1997 | Halls et al. |
| 2004/0067324 | A1* | 4/2004 | Lazarev ................ H01L 51/424 428/1.31 |
| 2005/0104089 | A1* | 5/2005 | Engelmann ............ H04N 5/365 257/204 |
| 2009/0255581 | A1* | 10/2009 | Myong ................. H01L 31/075 136/258 |
| 2011/0197956 | A1* | 8/2011 | Chang .................... B82Y 20/00 136/255 |
| 2012/0118723 | A1 | 5/2012 | Mao et al. |
| 2012/0167964 | A1* | 7/2012 | Tseng .................... H01L 25/047 136/255 |
| 2013/0019944 | A1 | 1/2013 | Hekmatshoar-Tabari et al. |
| 2013/0276887 | A1* | 10/2013 | Worfolk ............... C08G 61/126 438/93 |
| 2015/0129036 | A1* | 5/2015 | Lim ........................ H01L 31/06 136/259 |
| 2016/0005887 | A1 | 1/2016 | Lo et al. |

OTHER PUBLICATIONS

Allan, G., et al. Electronic structure and localized states in a model amorphous silicon. Phys. Rev. B 57, 6933-6936 (1998).
Atta-Fynn, R., et al. Electron-phonon coupling is large for localized states. Phys. Rev. B 69, 245204 (2004).
Bullot, J. et al. Physics of amorphous silicon-carbon alloys, physica status solidi (b). 143, 345-418 {1987).
Campbell, J.C. Recent advances in telecommunications avalanche photodiodes. Journal of Lightwave Technology 25, 109-121 (2007).
Chew, K. et al. Gap state distribution in amorphous hydrogenated silicon carbide films deduced from photothermal deflection spectroscopy.}. Appl. Phys. 91, 4319-4325 (2002).
Cody, G. D., et al. Disorder and the optical absorption edge of hydrogenated amorphous silicon. Phys. Rev. Lett. 47, 1480-1483 (1981).
Diadiuk, V., et al. Low dark-current, high gain GaInAs/InP avalanche photodetectors. IEEE Journal of Quantum Electronics.17, 260-264, (1981).
Drabold, D. A. et al. Electronic consequences of the mutual presence of thermal and structural disorder. Phys. Rev. B 60, R721-R725 (1999).
Hall, D., et al. Complementary metal-oxide-semiconductor compatible 1060 nm photodetector with ultrahigh gain under low bias. Opt. Lett. 40, 4440-4443 (2015).
Hernandez-Como, N., et al. Simulation of hetero-junction silicon solar cells with AMPS-1 D. Sol. Energ. Mat. Sol. Cells. 94, 62-67 {2010).
ISA, International Search Report and Written Opinion for International Application No. PCT/US2018/018076. dated Jun. 14, 2018. 14 pages.
Kang, Y. et al. Monolithic germanium/silicon avalanche photodiodes with 340 GHz gainbandwidth product. Nat. Photon. 3, 59-63 (2009).
Kim, H. et al. Electrical, optical, and structural properties of indium-tin-oxide thin films for organic light-emitting devices. J. Appl. Phys. 86, 6451-6461 (1999).
Liu, Y. H. et al. Cycling excitation process: An ultra efficient and quiet signal amplification mechanism.Appl. Phys. Lett. 1071 053505 (2015).
Liu, Y. H. et al. Cycling excitation process for light detection and signal amplification in semiconductors. Proc. SPIE. 9933, 99330C (2016).
McIntyre, R. J. The distribution of gains in uniformly multiplying avalanche photodiodes: theory. IEEE Trans. Electron. Dev. ED-19, 703-713 (1972).
Moore, A. R. Electron and hole drift mobility in amorphous silicon. Appl. Phys. Lett. 31, 762-764 (1977).
Niclass, C., et al. Design and characterization of a CMOS 3-D image sensor based on single photon avalanche diodes. IEEE Journal of So/id-State Circuits. 40, 1847-1854 (2005).
Schlaf, R., et al. Work function measurements on indium tin oxide films. J. Electron. Spectrosc. Re/at. Phenom. 120, 149-154 (2001).
Tsuji no, K., et al. Ultralow-noise readout circuit with an avalanche photodiode: toward a photon-number-resolving detector. Appl. Opt. 46, 1009-1014 (2007).
Zhou, Y. et al. Discovery of a photoresponse amplification mechanism in compensated PN junctions. Appl. Phys. Lett. 106, 031103 (2015).

\* cited by examiner

SYSTEMS, DEVICES AND METHODS FOR AMPLIFICATION OF SIGNALS BASED ON A CYCLING EXCITATION PROCESS IN DISORDERED MATERIALS

CROSS-REFERENCE TO RELATED APPLICATIONS

This patent document is a 371 National Phase Application of PCT Application No. PCT/US2018/018076 entitled "SYSTEMS, DEVICES AND METHODS FOR AMPLIFICATION OF SIGNALS BASED ON A CYCLING EXCITATION PROCESS IN DISORDERED MATERIALS" filed on Feb. 13, 2018 which claims the priority to and benefits of U.S. Provisional Patent Application No. 62/459,766 entitled "INTRINSIC MECHANISM FOR AMPLIFICATION OF SIGNALS IN DISORDERED MATERIAL" filed on Feb. 16, 2017. The entire contents of the aforementioned patent applications is incorporated by reference as part of the disclosure of this patent document.

STATEMENT REGARDING FEDERALLY SPONSORED RESEARCH OR DEVELOPMENT

This invention was made with government support under grant No. W911NF-16-2-0183 awarded by the Defense Advanced Research Projects Agency (DARPA), along with grant Nos. N00014-16-1-3206 and N00014-15-1-2211, awarded by the Office of Naval Research (ONR). The government has certain rights in the invention.

TECHNICAL FIELD

This patent document relates to signal amplification techniques, devices and systems using cycling excitation process.

BACKGROUND

Semiconductors are a class of materials whose electrical conductivity falls between that of a conductor and that of an in insulator. The unique atomic structure of semiconductors allows for control of their conductivity through the application of external stimuli such as electric currents, electromagnetic fields, and light. Most semiconductors are crystalline materials (e.g., silicon) in which dopants are commonly introduced so as to tune the semiconductor properties of the material. By precisely controlling the doping process, the distribution of charge carriers within the crystalline material can be shaped based on how charge is primarily transported in the material. N-type semiconductors primarily carry charge through the mobility of electrons and are therefore doped with electron donors, whereas p-type semiconductors utilize holes (i.e., the absence of electrons) and are therefore doped with electron acceptors. Both p-type and n-type domains can exist within a single semiconductor. The boundary of these domains form p-n junctions which allow for electrons to flow in one direction, but not the other. This property is fundamental to the operation of many electrical devices that include but are not limited to photovoltaics, transistors, integrated circuits, etc.

SUMMARY

Methods, systems, and devices are described for implementing photoelectrical signal amplification using cycling excitation process (CEP) in disordered materials.

In some aspects, a device for amplifying signals of light-induced photocurrent includes an anode connected to a positive terminal of a voltage source; a disordered material layer coupled to the anode, in which the disordered material layer is structured to have a thickness of 100 nm or less; and a cathode coupled to the disordered material layer and connected to a negative terminal of the voltage source, in which the device is operable to amplify photoexcited carriers based on photon absorption to produce an external quantum efficiency of the device that is at least 100%.

In some aspects, a method for amplifying signals of light-induced photocurrent includes receiving light on a surface of a device structured to include an anode connected to a positive terminal of a voltage source, a disordered material having a thickness of 100 nm or less coupled to the anode, and a cathode coupled to the disordered material and connected to a negative terminal of the voltage source; converting the absorbed photons to an electrical signal and amplifying photoexcited carriers to produce an electrical current flux that is greater than an incoming photon flux on the device, in which the electrical signal is presented at an electrode on device; and conducting the electrical signal to an electrical circuit.

In some aspects, a photodetector article for amplifying signals of light-induced photocurrent includes a disordered material including an amorphous semiconductor material or a polymer material that includes a dopant to convert photons to an electrical signal and amplify photoexcited carriers having their electron or hole mobility under $10 \text{ cm}^2/\text{V}^{-s}$ at an electric field 10 kV/cm below to produce an electrical current flux that is greater than an incoming photon flux on the device.

In some aspects, a device for amplifying signals of light-induced photocurrent includes an oxide electrode that is transparent or at least translucent; disordered material coupled to the oxide electrode at a first side, in which the disordered material is structured to have a thickness of 100 nm or less; an n-type material layer coupled to a second side opposite the first side of the disordered material, in which the oxide electrode is operable as a cathode and the n-type material is operable as an anode when the oxide electrode and the n-type material are electrically coupled to a voltage source; and a substrate coupled to the n-type material layer, in which the device is operable to convert photons absorbed at the disordered material to an electrical signal amplified across the disordered material by an amplification mechanism to produce an external quantum efficiency of the device that is at least 100%.

The subject matter described in this patent document can be implemented in specific ways that provide one or more of the following features.

DETAILED DESCRIPTION

Figure 1A:
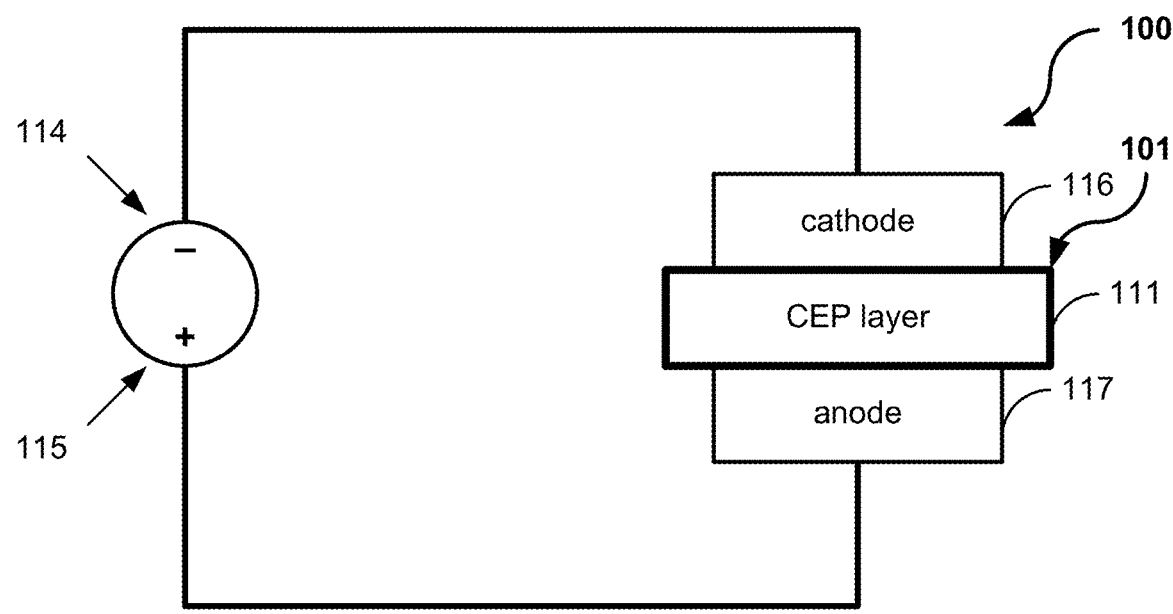
FIGS. 1A-1D show diagrams of example embodiments of a device for amplification of signals using a cycling excitation process (CEP) in accordance with the present technology.

Sensitivity, frequency response, power consumption, and process compatibility are among key considerations of photodetector technologies. Currently, the most sensitive semiconductor devices for optical detection combine internal amplification processes (i.e., impact ionization) and external amplification processes (i.e., transistor amplifier) to achieve the highest sensitivity for a photodetector device. This is exemplified by avalanche photoreceiver devices, which are typically used in optical communications applications.

One example of an avalanche photoreceiver device includes an avalanche photodetector (APD). Avalanche photodetectors are used in high sensitivity optical receivers owing to their internal gain mechanism from impact ionization. Yet, the impact ionization mechanism of APD devices is concatenated with an external amplification process by an electronic amplifier. As such, their optimal performance is found when the shot noise of the avalanche detector is equal to the thermal noise of the transistor amplifier, and thus is limited by high excess noise and gain-bandwidth product.

The amplification mechanism utilized by avalanche photodetectors relies on impact ionization. The basic principle behind the amplification mechanism for APD requires the emission (or ejection) of an electron in response to incident light (i.e., the photoelectric effect) from the valence band to the conduction band of the semiconductor. Once in the conduction band, the electron collides with an additional electron (i.e., impact ionization) that electron then in turn collides with another electron and so forth (i.e., avalanche effect). As such, one incident electron is responsible for exciting a large number of electrons and thereby serves to amplify the signal of the APD. The above process carried out by electrons can also occur by holes, and at the end the sum of electron flow and hole flow produces the net current. However, because this mechanism is reliant on impact ionization, a majority of the energy is lost by phonon scattering and only a small percentage of the energy is used for the impact ionization. As a result, the performance of APDs are limited particularly in that they require high voltage and manifest in a relatively low signal to noise ratio.

Furthermore, few devices can detect single photons, and most of the single-photon detectors such as photomultiplier tubes (PMTs) and superconductor detectors are expensive, bulky, not scalable, and difficult to use. The most common semiconductor single photon avalanche detector (SPAD) operates in Geiger mode where the device is actually biased above its breakdown voltage. As a result, SPAD needs to be quenched through a passive or active quenching circuit each time the device detects a single photon, making the design cumbersome and its performance limited by dark counts, after pulse, and recovery time. Above all, SPADs trade the dynamic range for their extreme sensitivity. Due to these limitations, they have only been used for niche applications such as quantum communications and LIDAR (light imaging, detection, and ranging), but are difficult to use in mass market applications such as commercial and medical imaging and communications.

While semiconductor technologies have advanced rapidly, progress in the internal amplification mechanisms in semiconductors has remained stagnant. Other than impact ionization, no effective and practical internal amplification mechanism has been found over the past four decades. However, an alternative mechanism for amplification (e.g., increased sensitivity) would have huge impact on a number of semiconductor applications such as optical communication, imaging and sensing. As such, devices and techniques using an alternative internal amplification mechanism in semiconductors that do not suffer the limitations of impact ionization would provide great benefits to a variety of applications including communications, imaging, sensing, etc.

One such internal amplification mechanism is the cycling excitation process (CEP). Cycling excitation process is a physical mechanism that can effectively amplify the signal with low noise and high efficiency. Applying this mechanism to devices such as photodetectors can result in superior device performance over avalanche photodetectors, which have been considered the most sensitive semiconductor photodetectors to date. CEP device utilizes intrinsic signal amplification process that is fundamentally different than the impact ionization process. CEP devices provided the most sought-after characteristics of semiconductors such as signal amplification by more than 4000 times at only 3V bias and excess noise factor that is 30 times lower than today's avalanche photodetectors. In addition, CEP devices can be generalized, which serves as a significant advancement applicable to a broad range of new materials, electronic devices, and amplification methods.

Notably the CEP mechanism is far more effective than conventional impact ionization as the CEP device can achieve a gain of over 1000 at bias voltage as low as 3 to 4 volts. In contrast, most commercial avalanche photodetectors operate at 20 to 200V at a gain of well below 1000 (typically between 10 and 100). This is largely attributed to the Auger excitation of carriers from localized states in disordered material, compared to impact ionization where all particles (electrons and holes) involved are in extended states in conduction and valence bands. Auger excitation involving localized state is far more efficient because the localized state greatly relaxes the k-selection rule (or momentum conservation) due to the uncertainty principle since a localized state, unlike travelling waves, does not possess a well-defined k-vector or momentum.

The CEP effect uses Auger excitation involving localized states to relax the k-selection rule that limits the efficiency of traditional impact ionization. Some example designs of CEP photodetector include a heavily-doped and heavily compensated p-n junction. Having these compensating impurities as localized states to support the CEP process, the primary photocurrent of the CEP photodetector provides efficient amplification with low excess noise and under low bias. Examples of these CEP photodetector devices and techniques are described in U.S. patent application Ser. No. 14/853,795, entitled "HIGHLY EFFICIENT OPTICAL TO ELECTRICAL CONVERSION DEVICES AND METHODS," which is incorporated by reference as part of this disclosure for all purposes.

Yet, the delicate balance in doping compensation presents significant challenges in dark current and process compatibility. There have been challenges associated with improving not only the device reproducibility, but also, reliability. Furthermore, the gain-bandwidth product and the required material properties to produce the CEP effect remain unclear. One particular challenge has been to demonstrate that the CEP effect can be generalized over a wide range of materials and is not just limited to a select few materials, such as crystalline silicon.

High density of localized states and strong electron-phonon coupling are two properties that favor the CEP effect. Certain semiconductor materials that possess such properties include disordered semiconductor materials. A disordered material is a material having a conduction band and a valence band where the valence and conduction bands do not have a defined cut off, but rather further include bandtails. In disordered materials, there are electronic states in the bandtails and within the bandgap (i.e., the energy difference between the valence and conduction band) with the magnitude of wave functions concentrated to a very narrow regime (e.g., sub-nanometer to a few nanometers). Furthermore, disordered materials possess extended electronic states (i.e., non-localized states) in the conduction band and valence band. Electrons and holes in these extended states have well-defined k-vectors and can be treated as travelling waves without localization. Electrons (holes) at these extended states can travel through the material and gain large kinetic energy from an externally applied field.

Herein, a new class of photodetector devices that employ disordered materials are disclosed. Methods, systems, and devices are described for signal amplification using disordered materials through cycling excitation process (CEP). For example, the disclosed photodetector devices amplify signals with exceedingly high gain, low noise, and low operation voltage, e.g., notably exceeding the amplification of conventional APD devices.

In some aspects, an article for amplifying photoelectrical signals in a CEP device includes a disordered material layer coupled to an anode and a cathode, in which the disordered material is structured to have a thickness of 100 nm or less and provide an external quantum efficiency of the CEP device of at least 100% and/or amplification gain of at least 10, e.g., and is capable of gain of 1,000 or greater. The CEP device is operable to produce a photocurrent flowing through the disordered material when a voltage bias is applied between the anode and the cathode, which can include a low voltage bias of at 12 V or less (e.g., including lower voltage bias corresponding to the thickness of the disordered material layer, such as 3 V or 4 V for thicknesses of 30 nm or less). The CEP device is operable to absorb light and amplify photoexcited carriers based on the photon absorption to produce an external quantum efficiency of the device that is at least 100%. The structure of the disordered material facilitates the hopping of the charge carriers (electrons and holes) across the relatively small thickness of the material layer, e.g., tens of nanometers or a hundred or low hundreds of nanometers. While charge carrier hopping is significantly slower mobility than that of crystalline materials (e.g., thousands of times slower), the CEP devices are capable of such high quantum efficiency, high gain photoelectric conversion and amplification at low applied voltage, e.g., as charge carriers in a disordered material gain sufficient kinetic energy based on inelastic scatterings that do not relax the energy fast enough. The small thickness of the disordered material allows for an energetic carrier to initiate the Auger excitation that will cause CEP amplification to produce the high external quantum efficiency for the device. In some implementations, the CEP device includes a light absorption layer coupled to the disordered material layer to absorb the incident light. In such implementations, the light absorption layer is coupled to the disordered material layer so that at least one type of photoexcited carriers (electrons or holes) can enter the disordered layer. In some examples, the disordered material layer is structured to have a density of localized energy states between the bandgap or at the bandtails of the conduction band and valence band of at least $1 \times 10^{18}$ cm$^{-3}$.

In some aspects, an article for amplifying photoelectrical signals in a CEP device includes a disordered material layer coupled to an n-type semiconductor layer and/or a p-type semiconductor, in which the disordered material is structured to have a density of localized energy states between the bandgap or at the bandtails of the conduction band and valence band of at least $1\times10^{18}$ cm$^{-3}$.

In some aspects, methods are disclosed for producing disordered materials for CEP devices, including, in some embodiments, using heavily-doped, heavily compensated p/n junction to modify crystalline silicon into a quasi-disordered material. For example, these doping impurities can be introduced during the growth of the epitaxial materials. Using heavily doped and heavily compensated Si p/n junction, as an example, one can introduce a large number of boron atoms and a slightly lower number of phosphorous atoms to form a partially compensated p-layer and then introduce a large number of phosphorous atoms and a slightly lower number of boron atoms to form a partially compensated n-layer. The two layers, typically no thicker than tens of nanometers each, form a partially compensated Si p/n junction that can produce the CEP effect.

Implementations of the disclosed materials, devices, systems and methods can include the following features. For example, the disclosed CEP devices operate under an alternative internal amplification mechanism that provides high gain, low noise and low operation voltage relative to avalanche photodetectors. For example, the design for the disclosed CEP devices can include a variety of materials including disordered semiconductor materials and disordered polymer materials to provide CEP properties, and therefore is not limited by a narrow range of crystalline materials. In addition, the CEP device has an extreme sensitivity to light, allowing it to reach the extreme sensitivity of a single photon. Furthermore, the CEP device provides improvements to a number of semiconductor dependent applications to include the non-limiting examples of enhanced imaging such as X-ray imaging, computed tomography (CT) scans, positron emission tomography (PET) scans, sensing particularly under low light conditions, optical communication particularly in low light conditions such as fog and/or smog, quantum cryptography, space communications, missile defense systems, free space optical communications and fiber optic communications.

Some implementations of the disclosed technology provide methods of making high performance CEP photodetectors by identifying required material properties for an effective gain medium, e.g., such as disordered materials described herein. Many effective CEP materials have actually low electron and hole mobility and contain a large number of localized states, which are considered defects from conventional electronic device points of view. In contrast to highly ordered single crystal semiconductors, CEP-friendly materials can be categorized as disordered materials and include amorphous semiconductors and polymers. Some implementations of the disclosed technology also provide systematic methods to create photodetectors with both efficient CEP gain and high quantum efficiency, and several example embodiments are provided.

In some embodiments, an example CEP device is structured to include a n-type semiconductor material contact layer (n-type contact) to provide an anode to connect to an external voltage source (e.g., bias voltage); a disordered material layer (e.g., also referred to as the CEP layer) connected to the n-contact layer to provide CEP signal amplification, in which the disordered material layer has an electron affinity ($E_a$) and an energy ($E_c$) that is the sum of the electron affinity and a bandgap (i.e., $E_c=E_a+E_g$); a light absorption layer having its own $E_a$ and $E_c$ values and coupled to the disordered material layer; and a p-type semiconductor material contact layer (p-type contact) connected to the light absorption layer and to provide a cathode connected to an external voltage source. For superior device performance, for example, the structure of the CEP device satisfy the following relations: $\Delta E_a$ and $\Delta E_c$ are both greater than zero or both less than zero, where $\Delta E_a$ and $\Delta E_c$ are the difference in $E_a$ and $E_c$ between the CEP layer and the light absorption layer next to the CEP layer. When such conditions are satisfied, the electron and hole transport between the CEP layer and the light absorption layer is most efficient without being hindered by any energy barrier at the material interface. In some implementations, for example, the disordered material layer (e.g., CEP layer) is capable of absorbing light such that the CEP device does not further comprise the light absorption layer.

In some embodiments, an example CEP device includes a p-contact layer connected to a cathode; a disordered material layer (e.g., CEP layer) connected to the p-contact layer; an optional light absorption layer coupled to the disordered material layer; and a n-contact layer connected to the light absorption layer (or disordered material layer) that couples the light absorption layer to an anode.

In some embodiments, an example CEP device is structured to include a substrate in which a layer of disordered material is formed over the substrate to provide a signal amplification medium through the CEP mechanism. The disordered material layer is also referred to as the CEP layer. The CEP device includes an anode and a cathode. In some implementations, the CEP device can include an electrode (e.g., indium tin oxide (ITO)) coupled to the CEP layer. In some implementations, the CEP device includes a contact pad isolated from the substrate by an insulation layer. In some implementations, the CEP device includes a light absorbing layer. In some implementations, the CEP layer capable of absorbing light such that the device does not include an additional absorption layer. In some implementations, the substrate is n+-Si substrate.

Example Embodiments for High CEP Gain and High Quantum Efficiency

FIG. 1A shows a diagram of an example embodiment of a device 100 for amplification of photoelectric signals using a cycling excitation process (CEP) photocurrent amplification mechanism in accordance with the present technology. The device 100 can be implemented as a CEP photodetector device that provides an enhanced signal amplification mechanism of the photoelectric effect. The CEP device 100 includes a disordered material or article 101 that is structured to have a density of localized energy states between the bandgap or at the bandtails of the conduction band and valence band of at least $1\times10^{18}$ cm$^3$, such that the disordered material can provide a high quantum efficiency of the CEP device 100 (e.g., of at least 100%) and/or amplification gain of at least 10, e.g., and is capable of gain of 1,000 or greater. In the example embodiment shown in FIG. 1A, the CEP device 100 includes the disordered material 101 to be configured as a disordered material layer 111 (e.g., also referred to as the CEP layer 111) coupled to a cathode electrode 116 and an anode electrode 117. In an example embodiment, the CEP device 100 is structured to have the CEP layer 111 coupled to the cathode 116 on one side, and coupled to the anode 117 on an opposing side. In various implementations of the device 100, for example, the CEP device 100 includes the anode 117 and the cathode 116 electrically connected to a voltage source, e.g., where the anode 117 is connected to a positive terminal 115 and the cathode 116 is connected to a negative terminal 116.

The particular structure and materials of the CEP device 100 as depicted in FIG. 1A provide an enhanced signal amplification mechanism using a cycling excitation process.

For example, in some implementations, the light is absorbed directly by the disordered material which produces the CEP amplification effect. In such implementations, even though the light can be incident from the anode side or from the cathode side, the anode and cathode materials can be chosen in such a way that these materials are substantially or semi-transparent to the operation wavelength to allow the disordered material to absorb the light.

Figure 1B:
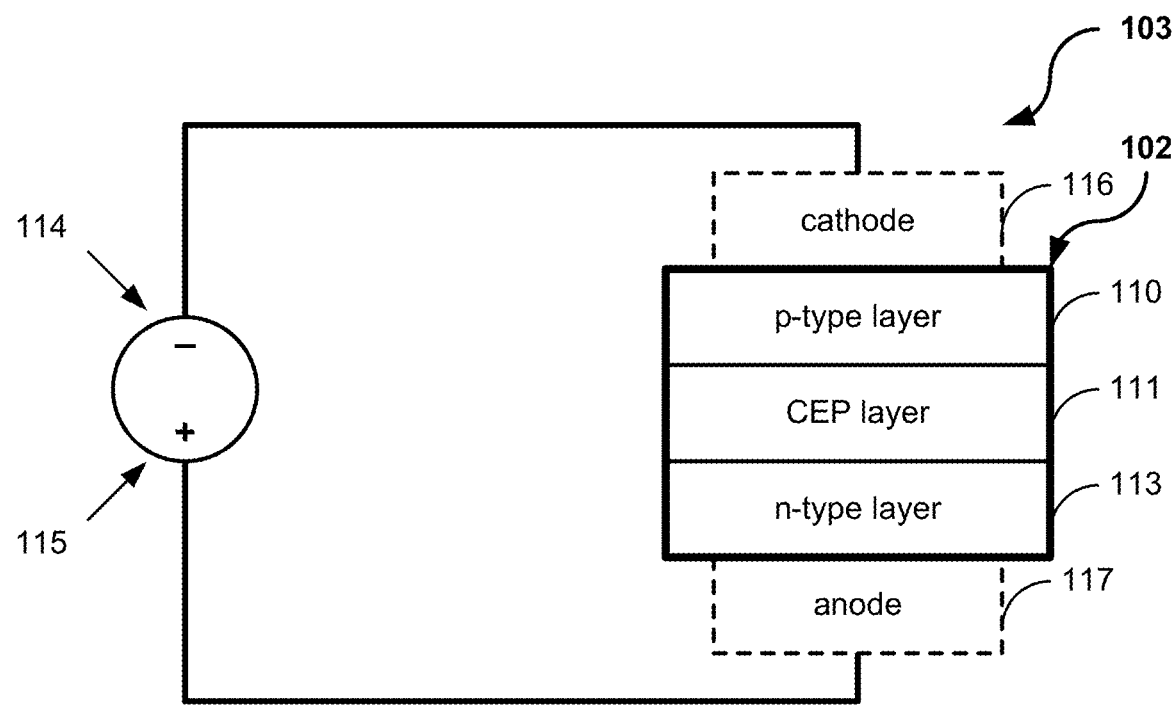

FIG. 1B shows a diagram of a further example embodiment of the CEP device 100 in accordance with the present technology, labeled CEP device 103 in FIG. 1B. In this example embodiment, the CEP device 103 includes the disordered material layer 111 (e.g., CEP layer 111) coupled to an n-type semiconductor layer 113 and a p-type semiconductor layer 110. In an example embodiment, the CEP device 103 is structured to have the CEP layer 111 coupled to the p-type semiconductor layer 110 on one side, and coupled to the n-type semiconductor layer 113 on an opposing side. For example, in some embodiments, the disordered material or article 101 can be configured to include disordered material layer 111, the n-type semiconductor layer 113, and the p-type semiconductor layer 110 formed as a composite material, labeled material or article 102 in FIG. 1B. In various implementations of the CEP device 103, for example, the device 103 includes an anode and a cathode that couples the device to a voltage source. In this embodiment of the device 103, for example, the p-type semiconductor layer 110 is formed on the CEP layer 111, which is formed on the n-type semiconductor layer 113, where the n-type semiconductor layer 113 is coupled with the anode electrode 117 to provide the anode side of the device 103, and the p-type semiconductor layer 110 is coupled with the cathode electrode 116 to provide the cathode side of the device 103. For example, the anode electrode 117 is connected to the positive terminal 115 of the voltage source, and the cathode electrode 116 is connected to the negative terminal 114 to drive the photodetector. In some implementations, for example, the n-type semiconductor layer 113 and the p-type semiconductor layer 110 can be directly connected to the voltage source (e.g., positive terminal 115 and negative terminal 114, respectively). In some embodiments, for example, the CEP device 103, and/or the disordered material 102, can include the CEP layer 111 coupled to one of the n-type semiconductor material layer 113 or the p-type semiconductor material layer 110, where the other semiconductor material layer is not included. The example structures and materials that comprise device 103, such as those depicted in FIG. 1B, can provide an enhanced signal amplification mechanism using a cycling excitation process.

Figure 1C:
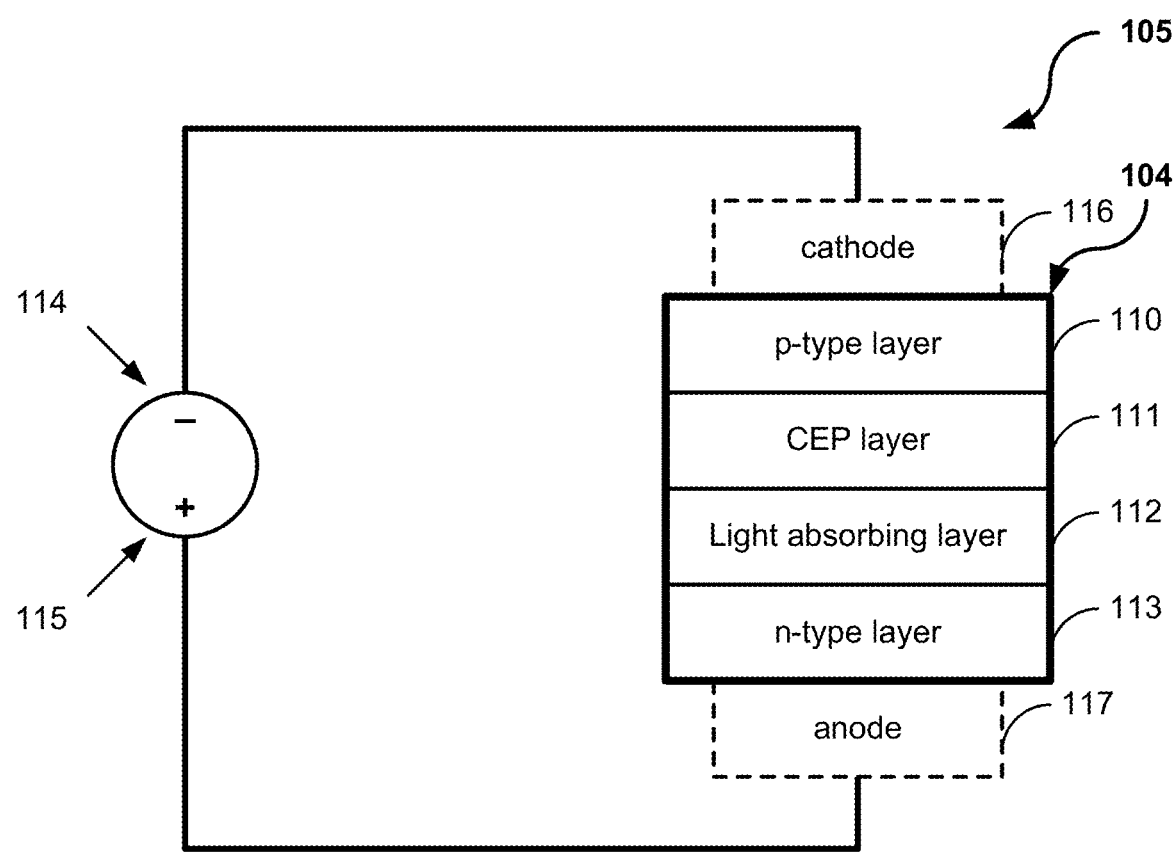

FIG. 1C shows a further example embodiment of the CEP device 100 in accordance with the disclosed technology, labeled CEP device 105 in FIG. 1C. The CEP device 105, in this embodiment, includes a light absorbing layer 112 coupled to the CEP layer 111 and between the n-type semiconductor layer 113 and the p-type semiconductor layer 110. The light absorbing layer 11, coupled to the disordered material, can increase light absorption by the CEP device to a sufficient amount of photons that induces the CEP amplification mechanism. The light absorbing layer 112 can include materials that have a different bandgap energy than the of the layer 111 and that aligns a bandgap overlap between the light absorption layer and the disordered material layer 111 to provide quantum efficiency of charge carriers transport between the light absorption layer and the second layer. For example, in some embodiments, the disordered material or article 101 can be configured to include disordered material layer 111, the light absorbing layer 112, the n-type semiconductor layer 113, and the p-type semiconductor layer 110 formed as a composite material, labeled as material or article 104 in FIG. 1C. In some embodiments, for example, the light absorbing layer 112 is coupled to the CEP layer 111 on one side and to the n-type semiconductor layer 113 on the other side. Whereas, in some embodiments of the CEP device 105 and/or the disordered material 104, the light absorbing layer 112 is coupled to the CEP layer 111 on one side and to the p-type semiconductor layer 110 on the other side. In the example embodiment of the CEP device 105 shown in FIG. 1C, for example, the p-type semiconductor layer 110 is formed on the CEP layer 111, which is formed on the light absorbing layer 112, which is formed on the n-type semiconductor layer 113; and the n-type semiconductor layer 113 is coupled with the anode electrode 117 to provide the anode side of the device 105, and the p-type semiconductor layer 110 is coupled with the cathode electrode 116 to provide the cathode side of the device 105. For example, the anode electrode 117 is connected to the positive terminal 115 of the voltage source, and the cathode electrode 116 is connected to the negative terminal 114 to drive the photodetector. Alternatively, in some implementations, for example, the p-type semiconductor layer 110 can be formed on the light absorbing layer 112, which can be formed on the CEP layer 111, which can be formed on the n-type semiconductor layer 113. In some implementations, for example, the n-type semiconductor layer 113 and the p-type semiconductor layer 110 can be directly connected to the voltage source (e.g., positive terminal 115 and negative terminal 114, respectively). In some embodiments, for example, the CEP device 105, and/or the disordered material 104, can include the CEP layer 111 coupled to one of the n-type semiconductor material layer 113 or the p-type semiconductor material layer 110, where the other semiconductor material layer is not included. The example structures and materials that comprise CEP device 105, like the example depicted in FIG. 1C, can provide an enhanced signal amplification mechanism using a cycling excitation process.

Figure 1D:
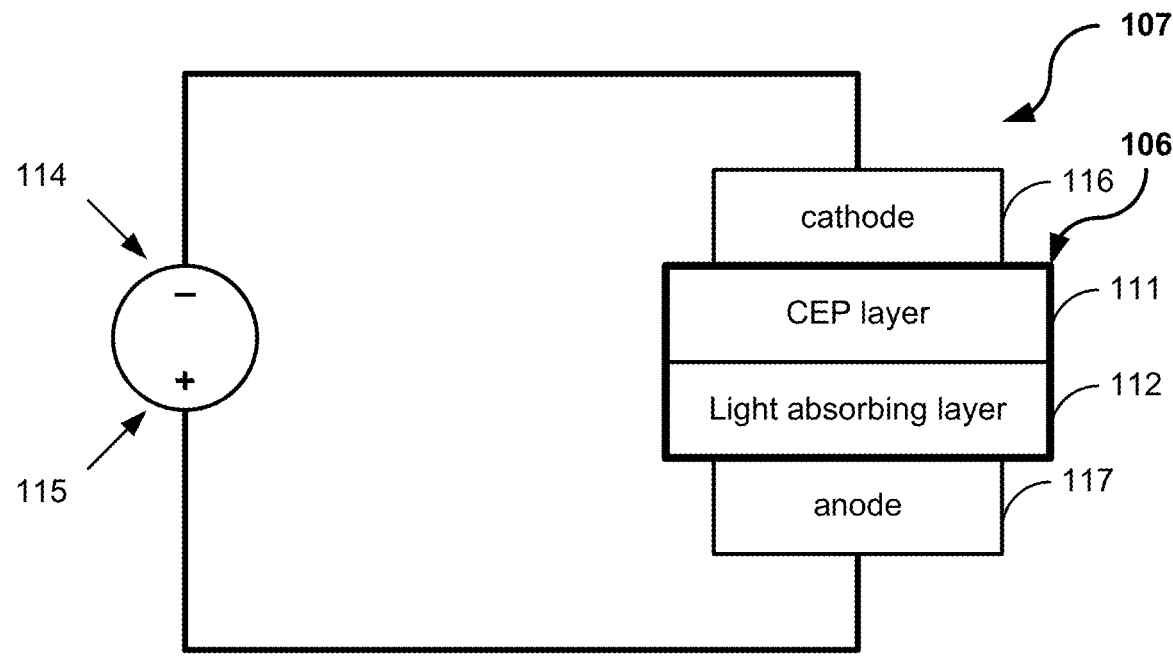

FIG. 1D shows a further example embodiment of the CEP device 100 in accordance with the disclosed technology, labeled CEP device 107 in FIG. 1C. The CEP device 107, in this embodiment, includes the light absorbing layer 112 coupled to the disordered material layer (e.g., CEP layer 111), in which the disordered material layer 111 is coupled to the cathode electrode 116 and the light absorbing layer 112 is coupled the anode electrode 117. In other example embodiments, the disordered material layer 111 can be coupled to the anode electrode 117 and the light absorbing layer 112 can be coupled the cathode electrode 116. In the example embodiment shown in FIG. 1D, the CEP device 107 includes a disordered material 106, which includes the disordered material layer 111 and the light absorbing layer 112, which is coupled between the cathode electrode 116 and the anode electrode 117. The particular structure and materials of the CEP device 107 as depicted in FIG. 1D can provide an enhanced signal amplification mechanism using a cycling excitation process. For example, in some implementations, the light is absorbed directly by the light absorbing layer 112 that is optically coupled to the disordered material layer 111 that produces the CEP amplification effect. In such implementations, even though the light can be incident from the anode side or from the cathode side, the anode and cathode materials can be chosen in such a way that these materials are substantially or semi-transparent to the operation wavelength to allow the light absorbing layer 112 to absorb the light.

In various embodiments of the CEP devices in accordance with the present technology, the disordered material layer 111 can include a myriad of materials for the implementation of a photodetector device for the amplification of signals based on CEP. For example, some main criteria for the disordered material layer 111 (e.g., the CEP layer 111) that produces CEP effect include an abundance of localized states between the conduction and valence bands where the localized states have a density of at least about $1 \times 10^{18}$ cm$^{-3}$, and in some implementations much higher (e.g., $1 \times 10^{19}$ cm$^{-3}$). The disordered material layer 111 used as the CEP layer for the device has the additional advantages in that the material can support high energy phonons, polarized phonon modes and/or localized phonon modes. In particular, the high energy phonons are efficient for excitation of the localized carriers into the mobile bands following the Auger excitation mechanism. The polarized phonons and/or localized phonons can enhance the electron (hole)-phonon coupling, thus increasing the rate of phonon-assisted excitation. The above conditions can be met by introducing "doping of light atoms" into the disordered material layer 111. For example, a small amount (e.g., 5%, or less) of carbon (C) or nitrogen (N) can be doped into amorphous silicon. Both carbon and nitrogen have a much lighter mass than silicon, can therefore support high energy phonon modes since the energy of optical phonons is roughly inversely proportional to the square root of the atomic mass. Also, these atoms, particularly nitrogen, have a different electron affinity than silicon, thus producing optical phonons with electric dipoles for enhanced interactions with electrons and holes. For example, these light atoms such as carbon and nitrogen, unlike boron and phosphorous, do not increase the conductivity of a-Si (amorphous silicon) and therefore, do not increase dark current of the device, which is a desirable characteristic of a semiconductor device. Rather, the addition of carbon or nitrogen can drastically reduce the dark current and therefore, further reduces the noise and power consumption of the CEP device.

The disordered material layer 111 of the CEP device 100 (or other sub-embodiments of the CEP device 100, such as the CEP device 103 and the CEP device 105) includes a disordered material that possesses an energy density of localized energy states between the bandgap or at the bandtails of the conduction band and valence band of at least $1 \times 10^{18}$ cm$^{-3}$. For example, these localized states can have an energy density of acceptor or donor impurities of at least about $1 \times 10^{18}$ cm$^{-3}$, or, in some examples an energy density in a range between $1 \times 10^{18}$ cm$^{-3}$ and $1 \times 10^{19}$ cm$^{-3}$. In some examples, the disordered material includes an energy density of localized energy states between the bandgap or at the bandtails of the conduction band and valence band of at least $1 \times 10^{19}$ cm$^{-3}$.

In some implementations, the disordered material layer 111 can include materials that are amorphous and/or have disordered states. In some implementations, the disordered material layer includes, but is not limited to, amorphous silicon. Therefore, using the disclosed methods, systems and devices, the CEP mechanism can be controlled to occur in materials besides crystalline silicon. For example, the disordered material can provide a carrier mobility at least about 1000 times lower than that of crystalline material (e.g., single-crystal silicon).

In some implementations, the disordered material layer 111 providing the CEP mechanism is intrinsically disordered (i.e., requires no chemical modification in order to introduce disorder); whereas, in some implementations, disorder is introduced through modification of ordered material (e.g., modified single crystal silicon). In some implementations, for example, the disordered material includes polymers (e.g., including amorphous polymers) such as the non-limiting examples of P3HT (poly(3-hexylthiophene-2,5-diyl), PDBT, PPV (polyphenylene vinylene), PCE, PDPP-DTT, PTAA, Alq3, PCBM (phenyl-$C_{61}$-butyric acid methyl ester), pentacene, triphenyl diamin (TPD) derivatives of carbazole, or phthalocyanine. In some implementations, for example, the disordered material includes amorphous SiGe (a-SiGe), amorphous GaAs (a-GaAs), amorphous InP (a-InP), amorphous GaN (a-GaN), amorphous AN (a-AlN), amorphous BN (a-BN), or amorphous SiC (a-SiC). In some implementations, for example, the disordered material includes amorphous semiconductor such as, but not limited to amorphous Si, amorphous Ge, or amorphous SiGe. In some implementations, for example, the disordered material includes doped amorphous Si, amorphous Ge, or amorphous SiGe; whereas, in some implementations, for example, the disordered material is doped with carbon or nitrogen.

In some implementations, the disordered material layer 111 of the CEP device 100 (or other embodiments) includes a thickness less than about 100 nm. In some implementations, for example, the disordered material layer 111 can be configured to have a thickness in a range of 10 nm to 100 nm. Whereas, in some implementations, the disordered material layer 111 can be configured to have a thickness less than 10 nm. For example, in certain embodiments, the disordered material layer has a thickness between about 30 nm and about 60 nm.

In some implementations, the device 100 can be used to enhance imaging such as X-ray imaging, computed tomography (CT) scans, positron emission tomography (PET) scans, sensing particularly under low light conditions, optical communication particularly in low light conditions such as fog and/or smog, quantum cryptography, quantum communications, space communications, missile defense systems, remote sensing, security and fiber optic communications. In some implementations, the device 100 can detect phonons to form images from the far infrared to the X-ray region of light.

In some implementations, the disordered material layer 111 can be deposited on a variety of substrates (e.g., of differing material types), including non-limiting examples of polycrystalline, dielectric, metal, and plastic substrates that can be rigid, flexible, or compliant. Deposition of the disordered material 111 can be implemented without the conventional limitations like concerns of lattice match, which has been a key requirement and limiting factor when growing single-crystalline epitaxial films on the substrate. For example, such unprecedented flexibility and simplicity will not take away from the unique characteristics of CEP effect, but can add tremendous flexibility and compatibility with other processes for various applications.

Figure 2:
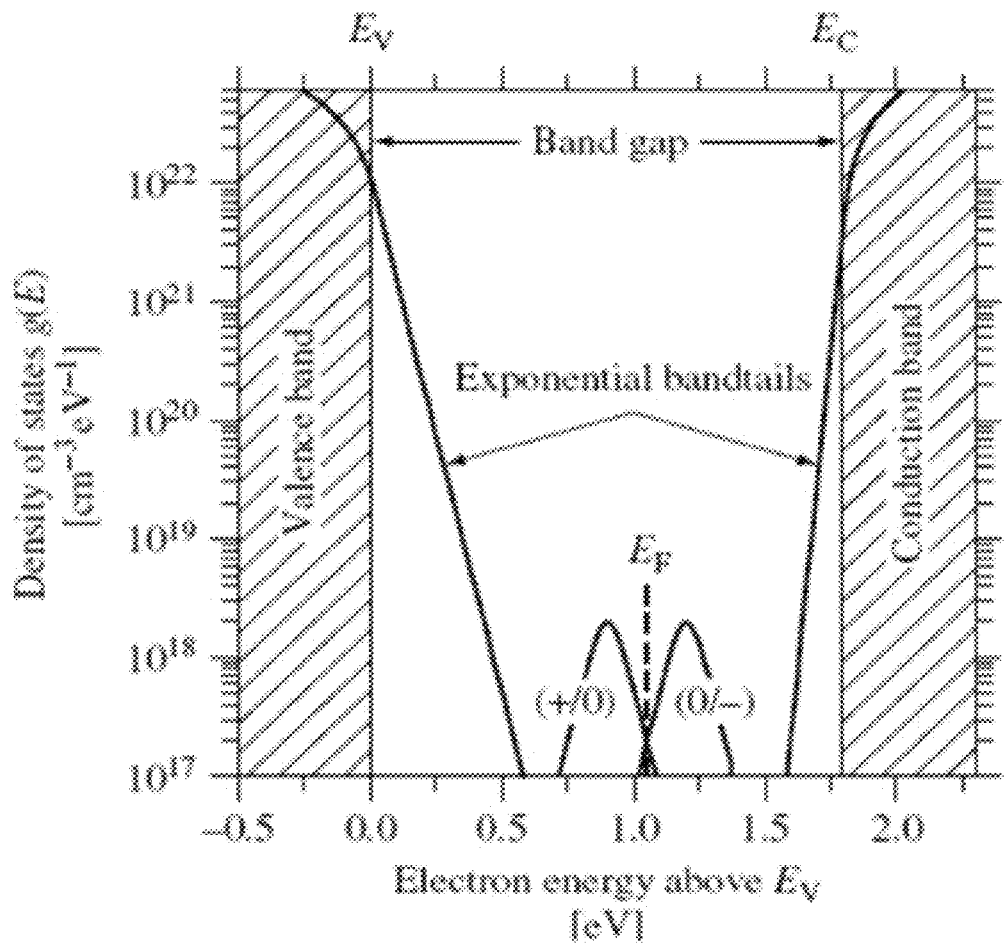
FIG. 2 shows an example diagram of the band structure of undoped amorphous silicon to exhibit characteristics of an example disordered material.

FIG. 2 shows a diagram of the band structure for an example disordered material layer of the device 100. In this particular example, the disordered material is amorphous silicon in which impurities have not been added (i.e., no doping). The relative energies of the conduction band ($E_c$) and valence band ($E_v$) define the boundaries between the extended states (e.g., not localized states) (shaded area) and the localized states in the bandtails. In addition, there are states within the bandgap to pin the Fermi level (e.g., bending the bands to create an energy barrier for the electrons and holes). This diagram exemplifies the distribution of density of states in the band gap of amorphous silicon. Lacking long range order like crystalline silicon, amorphous silicon possesses the properties of disordered material with bandtails in the conduction and valence band as well as states within bandgap to pin the Fermi level. The diagram of FIG. 2 exhibits one example of the desirable band structure for the disordered material layer 111, which is not limited to the amorphous silicon. While the bandtail states are desirable for CEP effect, the number of deep levels in the middle of bandgap should be reduced because electrons (or holes) in these deep states cannot easily escape via phonon absorption of tunneling. For amorphous silicon, for example, hydrogen passivation of the dangling bonds of silicon is effective in reducing or removing those mid-gap (deep) states while maintaining the high density of bandtail states.

In order to achieve high performance, CEP effect must also have a high efficiency to convert the photon flux into primary electron flow. Quantum efficiency is referred to as the ratio of the primary electron flow and the incoming photon flux. To achieve high quantum efficiency, photoexcited carriers need to reach their respective electrode (e.g., electrons to the anode, and holes to the cathode) by overcoming either no or a minimal potential barrier. In example embodiments employing the light absorbing layer 112, such as the CEP device 105 of FIG. 1C, for example, an important consideration for high device quantum efficiency includes obtaining an optimal band alignment between the disordered material layer 111 and the light absorbing layer 112.

Figure 3:
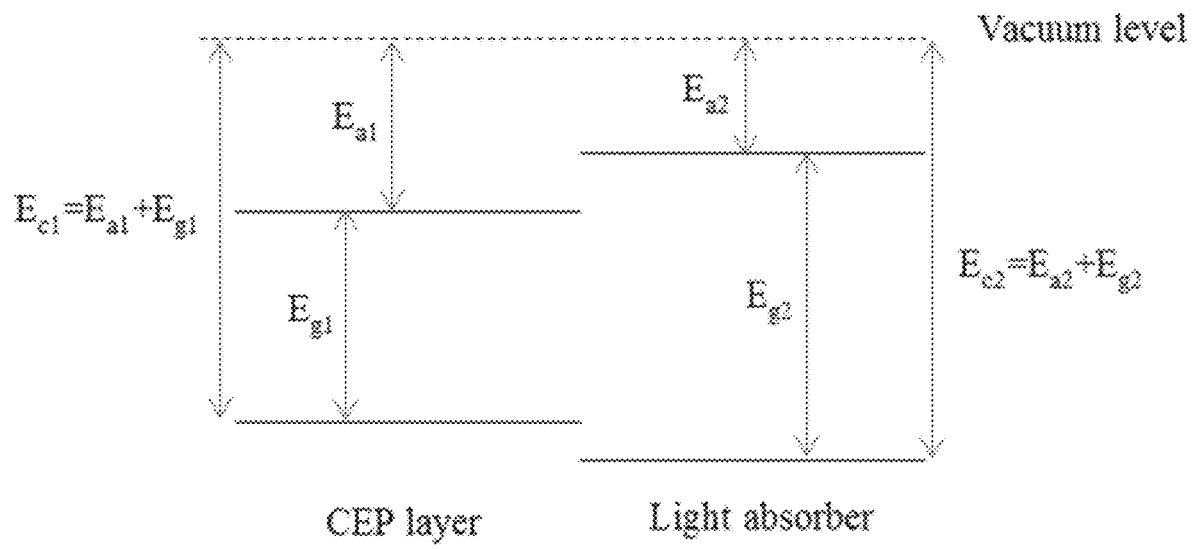
FIG. 3 shows an example energy diagram for the CEP layer and light absorbing layer.

FIG. 3 shows an example band diagram for an example disordered material layer 111 and example light absorbing layer 112. The band diagram shows important parameters including electron affinity ($E_a$) and the sum of the electron affinity and the bandgap ($E_g$), denoted as $E_c=E_a+E_g$. $\Delta E_a$ and $\Delta E_c$ can be further defined as the difference in $E_a$ and $E_c$ between the disordered material layer 111 (e.g., CEP layer) and the light absorbing layer 112, respectively.

In some implementations of a CEP device, for example, the following conditions are to be satisfied, at the same time, in order to achieve high quantum efficiency and high CEP gain:

$\Delta E_a>0$ and $\Delta E_c>0$ or $\Delta E_a<0$ and $\Delta E_c<0$.

In the case of $\Delta E_a>0$ and $\Delta E_c>0$, the light absorbing layer 112 should be connected to the p-type semiconductor material layer 110 contact, e.g., which can be connected to the bias voltage source directly or to an electrode (e.g., cathode 415) to provide the cathode, like that shown in FIG. 4A below.

In the case of $\Delta E_a<0$ and $\Delta E_c<0$, the light absorbing layer 112 should be connected to the n-type semiconductor material layer 112 contact, e.g., which can be connected to the bias voltage source directly or to an electrode (e.g., anode 117) to provide the anode, like that depicted for the device 105 of FIG. 1C.

Figure 4A:
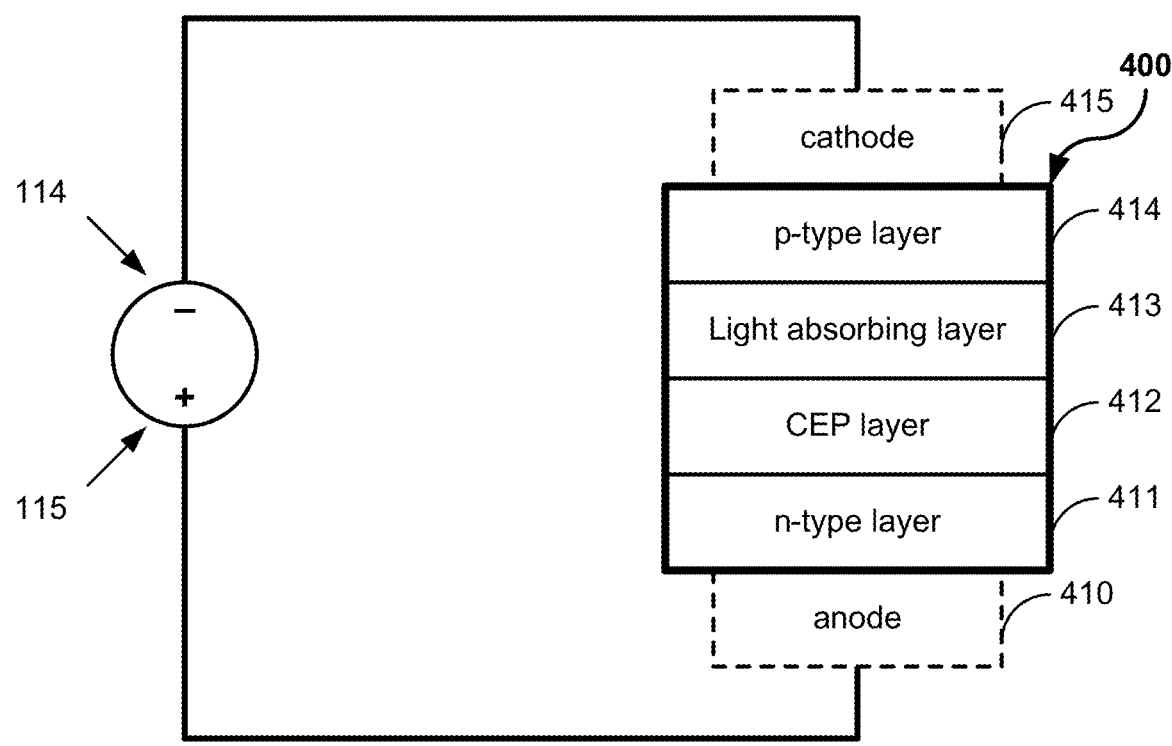
FIG. 4A shows an example energy band diagram that satisfies the conditions for both high CEP gain and high quantum efficient where $\Delta Ea>0$ and $\Delta Ec>0$, and having the light absorption layer connected to the cathode.
Figure 4A:
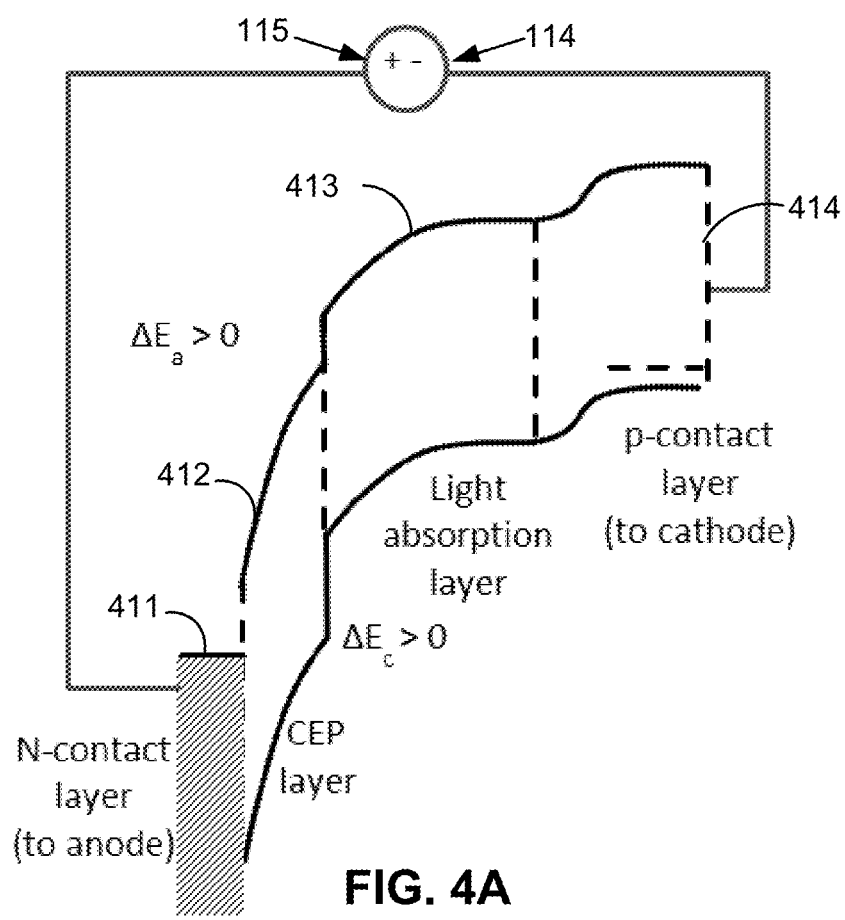
Figure 4B:
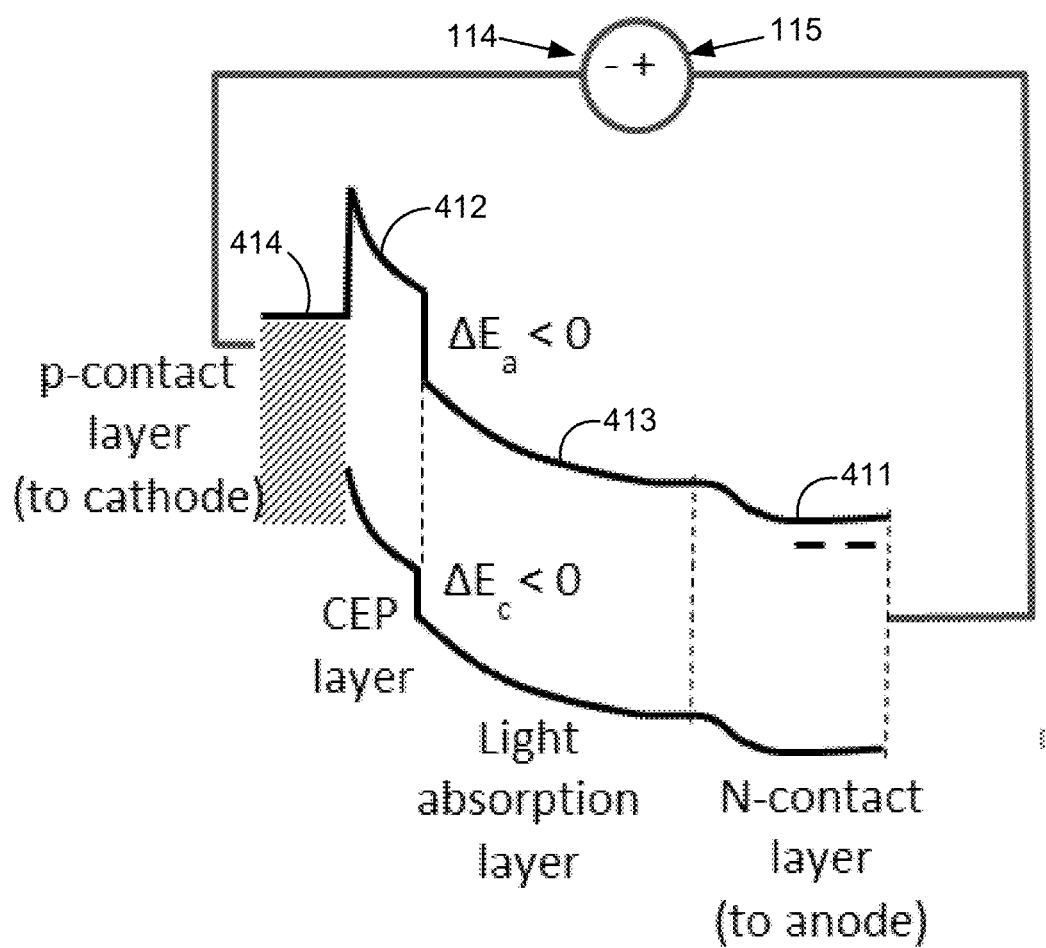
FIG. 4B shows an example energy band diagram that satisfies the conditions for both high CEP gain and high quantum efficient where $\Delta Ea<0$ and $\Delta Ec<0$, and having the light absorption layer connected to the anode.

FIGS. 4A and 4B show an example energy band diagram for each case. FIG. 4A shows the energy band diagram of an example CEP device that satisfies the condition of $\Delta E_a>0$ and $\Delta E_c>0$, in which the light absorption layer is coupled to the p-type semiconductor material configured as or connected to the cathode. FIG. 4A also shows a diagram of an example embodiment of the CEP device 100 (labeled as device 400 in FIG. 4A) that satisfies this design condition $\Delta E_a>0$ and $\Delta E_c>0$. In this embodiment, the device 400 an anode 410 is in operative communication with an n-type semiconductor contact layer 411, which is coupled to a disordered material layer 412 to provide the CEP layer 412. The disordered material layer 412 is coupled to a light absorbing layer 413, which is coupled to a p-type semiconductor contact layer 414 that is in operative communication with a cathode 415.

In example implementations, the device 400 is biased in such a way that the photoelectrons move towards the anode 410 without experiencing any energy barrier at the interface between the disordered material layer 412 and the light absorption layer 413. Also, during operation, extra holes produced by the CEP amplification are concurrently moving towards the cathode 415 without experiencing any energy barrier at the interface of the disordered material layer 412 and the light absorption layer 413. As a result, the example device 400 depicted in FIG. 4A satisfies the above conditions and can therefore obtain high quantum efficiency and high CEP gain.

FIG. 4B shows the energy band diagram of an example CEP device that satisfies the condition of $\Delta E_a<0$ and $\Delta E_c<0$, in which the light absorption layer is coupled to the n-type semiconductor material configured as or connected to the anode. FIG. 1C shows the example device 105, which is structured to meet the above conditions in operations. In implementations, for example, the device 105 is biased in such a way that the photoexcited holes move towards the cathode 116 without experiencing any energy barrier at the interface between the disordered material layer 111 and the light absorbing layer 112. The extra electrons produced by the CEP amplification are concurrently moving towards the anode 117 without experiencing any energy barrier at the interface of the disordered material layer 111 and the light absorbing layer 112. As a result, the example CEP device 105 depicted in FIG. 1C satisfies the above conditions and can therefore obtain high quantum efficiency and high CEP gain.

Figure 5:
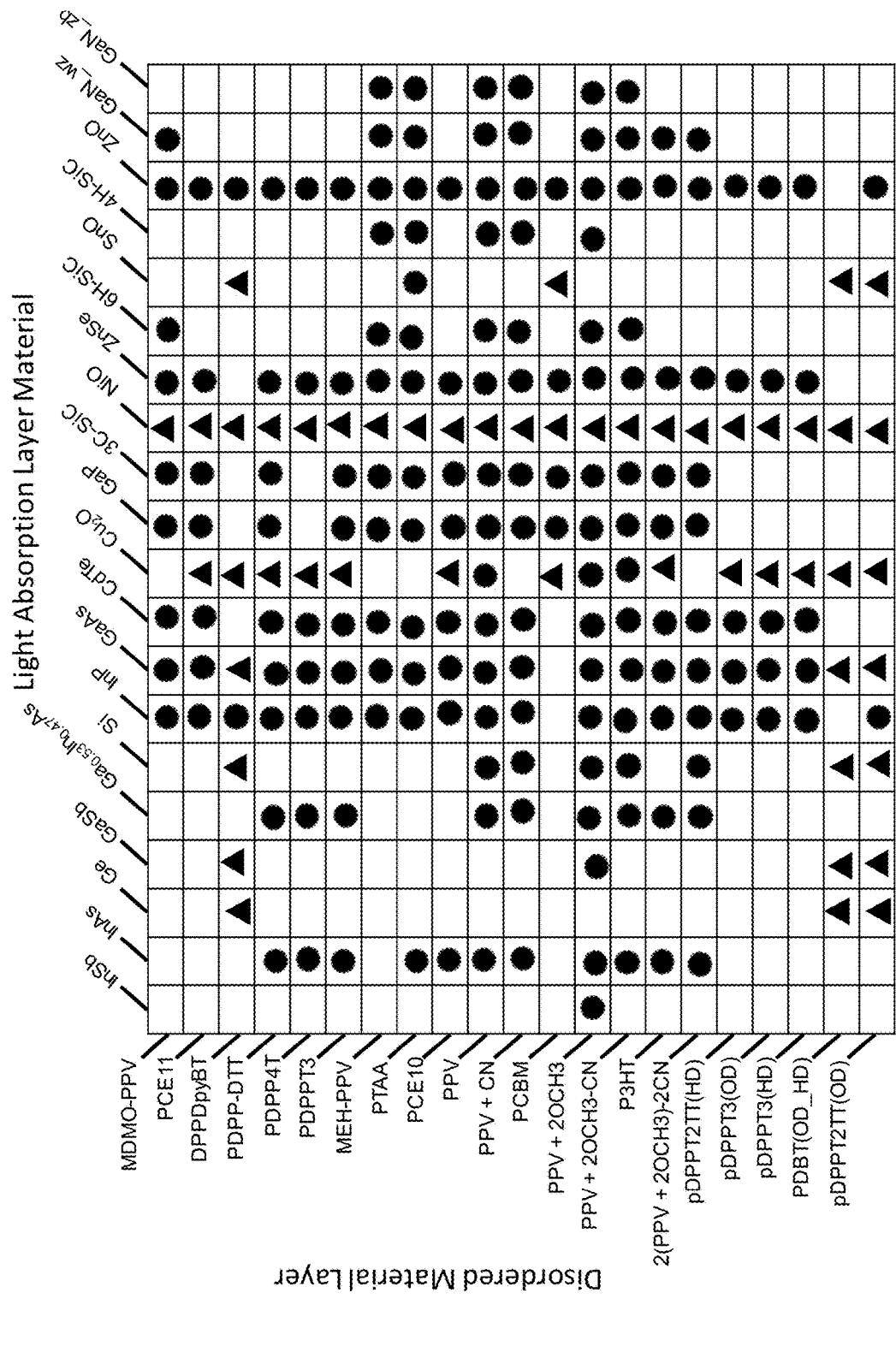
FIG. 5 shows an example table of combinations of example polymer based CEP layers and light absorption layers.
Figure 6:
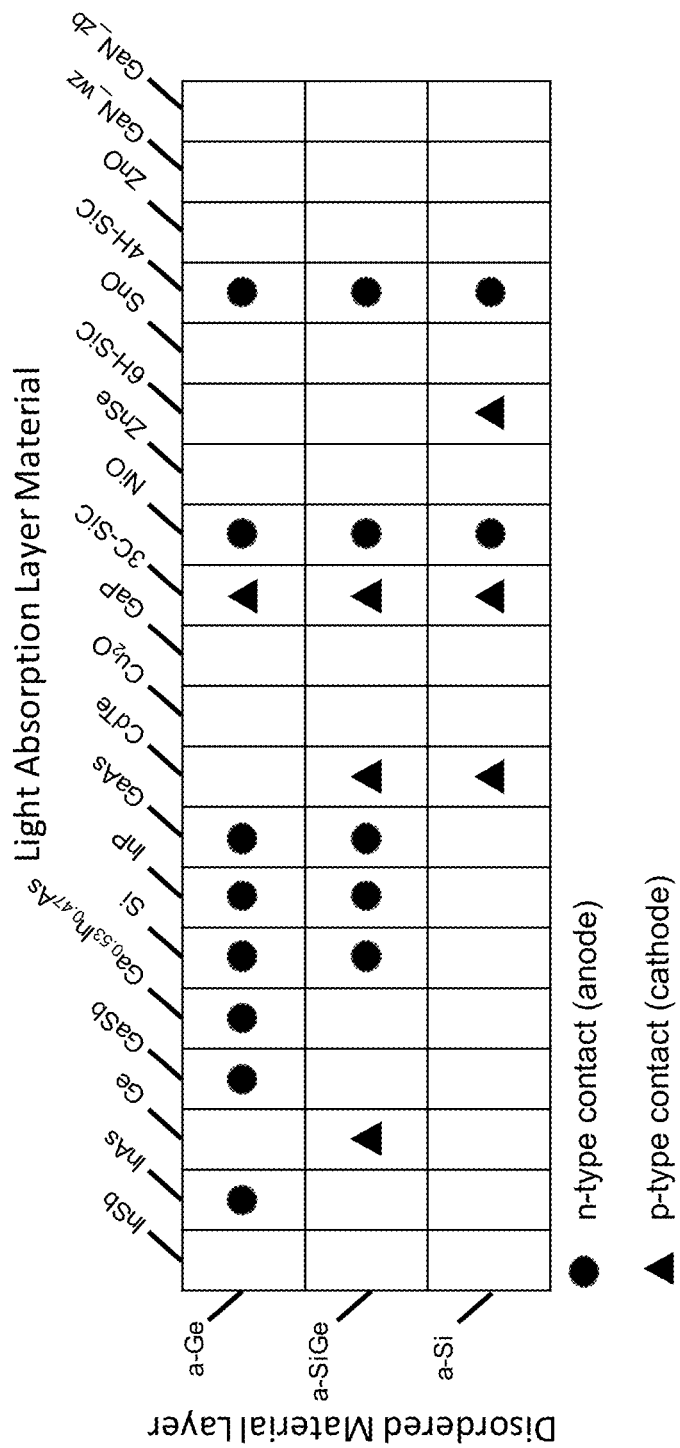
FIG. 6 shows an example table of combinations of example amorphous semiconductor based CEP layers and light absorption layers.

Example Designs with Polymer or Amorphous Semiconductor Disordered Material Layer FIGS. 5 and 6 provide a table that lists specific embodiments that satisfy the requirements for the combination of the disordered material layer and the light absorption layer, such as of the CEP device 105 and the CEP device 400. The tables of FIGS. 5 and 6 include only a subset of example materials (e.g., disordered materials and light absorption materials) that can be combined in implementations of a CEP device in accordance with the present technology. However, any combination of disordered materials and light absorption materials that satisfy the conditions discussed herein can be used, i.e., condition (i) $\Delta E_a>0$ and $\Delta E_c>0$, in which the light absorption layer is in connection with the p-contact layer (or cathode); or condition (ii) $\Delta E_a<0$ and $\Delta E_c<0$, in which the light absorption layer is in connection with the n-contact layer (or anode).

In some implementations, the CEP device does not need the additional light absorbing layer because the disordered material layer responsible for the amplification of the signal is capable of absorbing light, e.g., photons received at the n-type or p-type semiconductor material layer and absorbed by the disordered material. For example, in some implementations, the light is absorbed directly by the disordered material which produces the CEP amplification effect. In such implementations, even though the light can be incident from the anode side (e.g., n-type semiconductor material layer) or from the cathode side (e.g., p-type semiconductor material layer), the anode and cathode materials can be chosen in such a way that these materials are substantially or semi-transparent to the operation wavelength to allow the disordered material to absorb the light.

Yet, for some example disordered materials for the disclosed CEP devices, the disordered material would benefit from an additional light absorbing layer that increases light absorption to a sufficient amount of light that induces the CEP amplification effect. In such implementations, a light absorbing material is connected to the disordered material layer and absorbs light, creating an electron(hole) pair. Yet, in order to facilitate the transfer of the electron(hole) pair from the light absorbing layer to the disordered material layer, which is required for the amplification effect to occur, the band diagram of the disordered material and light absorbing material must have an optimal alignment. When the band gaps are well aligned, the combination of the two materials can facilitate the transport of the electron(hole) pair to the CEP layer to provide 100% transport efficiency. However, when poorly aligned, the materials can have less than a 1% transport efficiency. Accordingly, the combination of the disordered material and light absorbing material can require a judicious selection process aimed towards determine an ideal combination that can provide the greatest transport efficiency.

FIG. 5 shows a table of example configurations of the light absorption layer for an example disordered material including a polymer material less than about 100 nm (e.g., 30 nm to about 60 nm thick). In the example, the polymer material is considered to be of a special class of disordered material where the conduction and valence bands are defined by the HUMO and LUMO of the material and have a large number of localized states between HUMO and LUMO. In FIG. 5, the light absorption layer 115 is a semiconductor of different bandgap energy than the disordered material layer 111 (i.e. the CEP layer). Circles represent designs having the light absorption layer connected to the n-contact layer or anode, and triangles represent designs having the light absorption layer connected to the p-contact layer or cathode.

FIG. 6 shows a table of example configurations of the light absorption layer for an example disordered material layer that includes amorphous semiconductor, e.g., such as amorphous Si, amorphous Ge, and amorphous SiGe. Such amorphous semiconductors can be deposited by chemical vapor deposition or sputtering onto the light absorption layer. Circles represent designs having the light absorption layer connected to the n-contact layer or anode, and triangles represent designs having the light absorption layer connected to the p-contact layer or cathode.

Example Implementations of CEP Devices

Figure 7A:
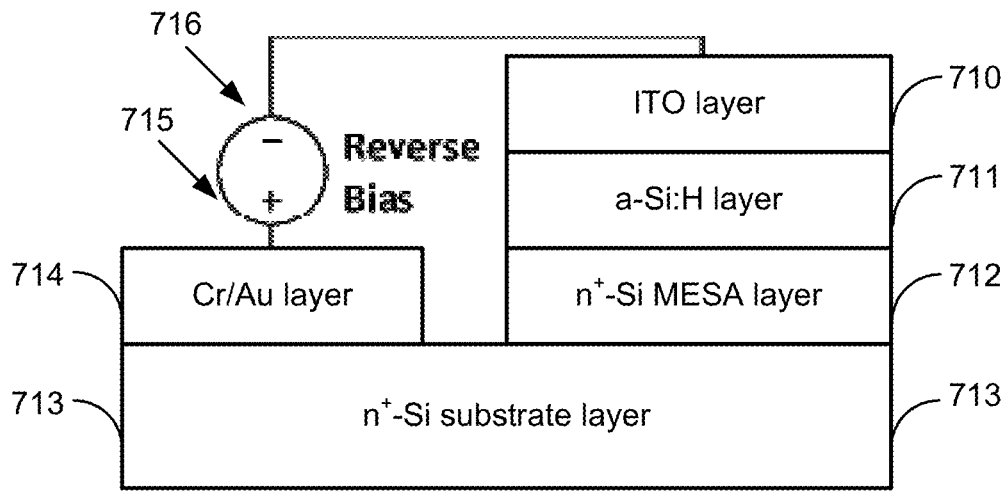
FIG. 7A shows a diagram illustrating the cross section of an example embodiment of a CEP device in accordance with the present technology.

FIG. 7A shows a diagram of a further example embodiment of the CEP device 100 in accordance with the disclosed technology, labeled CEP device 700 in FIG. 7A. The device 700, in this embodiment, includes a a-Si:H disordered material layer 711 that is coupled to a transparent electrode layer 710 (e.g., an indium tin oxide (ITO) transparent electrode layer 710) on one side and an n$^+$-Si MESA n-type semiconductor layer 712 on the other side. In this example, the mesa defines the photosensitive area and the top contact electrode, and another electrode can be formed on the bottom of the mesa. The n$^+$-Si MESA n-type semiconductor layer 712 is further coupled to an n$^+$-Si substrate 713, in which the n+-Si substrate is also coupled to a Au/Ti contact layer 714. In some implementations, the device 700 can be connected to the voltage source directly (e.g., positive terminal 715 and negative terminal 714), respectively, and operated under reverse bias.

Figure 7B:
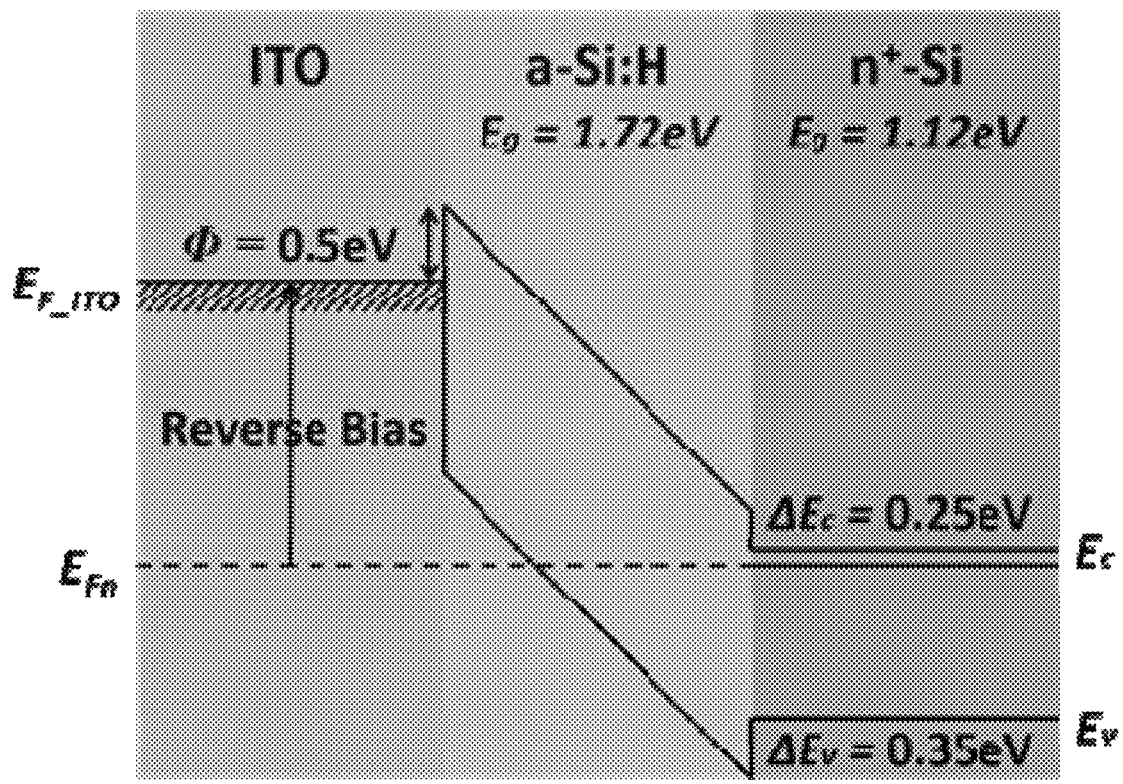
FIG. 7B shows an example band structure of the device in FIG. 7A.

FIG. 7B shows a plot depicting an example band diagram of the device 700 under reverse bias. The band diagram of FIG. 7B shows the band offsets and energy barriers between different layers, for the indium tin oxide (ITO) transparent electrode layer 710, the disordered material layer 711, and the n$^+$-Si substrate layer 713. The electron affinity of the indium tin oxide (ITO) transparent electrode layer 710, the a-Si:H disordered material layer 711 and n$^+$-Si substrate layer 713 are taken to be 4.3 eV, 3.8 eV and 4.05 eV, respectively.

It is noted that the band diagram for the device 700 shown in FIG. 7B is like that of a diode I-V characteristic. For example, the electron affinity of 4.3 eV, 3.8 eV and 4.05 eV for the ITO layer, the disordered material layer, and the substrate layer, respectively, leads to a conduction band offset of 0.5 eV and 0.25 eV at ITO to a-Si:H junction and a-Si:H to n$^+$-Si interface, respectively. Furthermore, the bandgap energy is about 1.72 eV for a-Si:H and about 1.12 eV for n$^+$-Si. There exists a hole barrier of 1.2 eV from ITO to a-Si:H and a valence band offset of 0.35 eV at the interface between a-Si:H and n$^+$-Si, thus giving a forward bias turn-on voltage of around 2V.

Figure 8A:
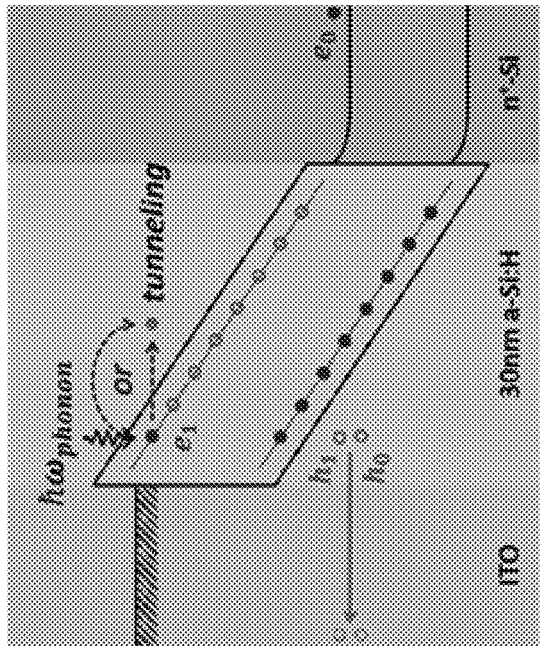
FIGS. 8A-8D show illustrative diagrams depicting an example cycling excitation process implemented by an example embodiment of a CEP device in accordance with the present technology.
Figure 8B:
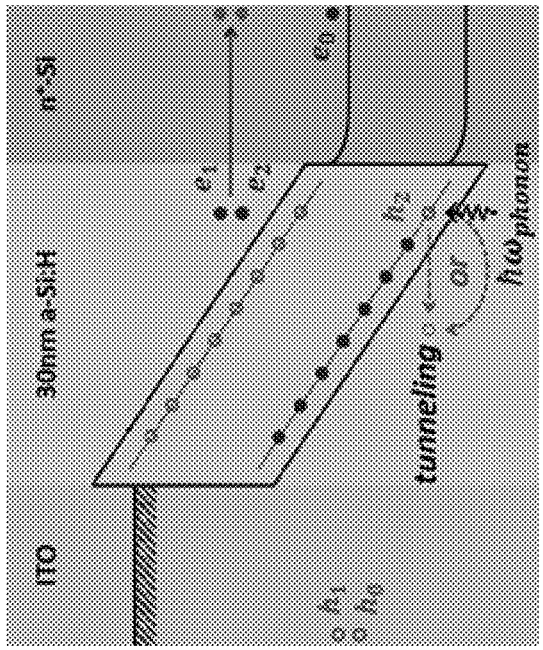
Figure 8C:
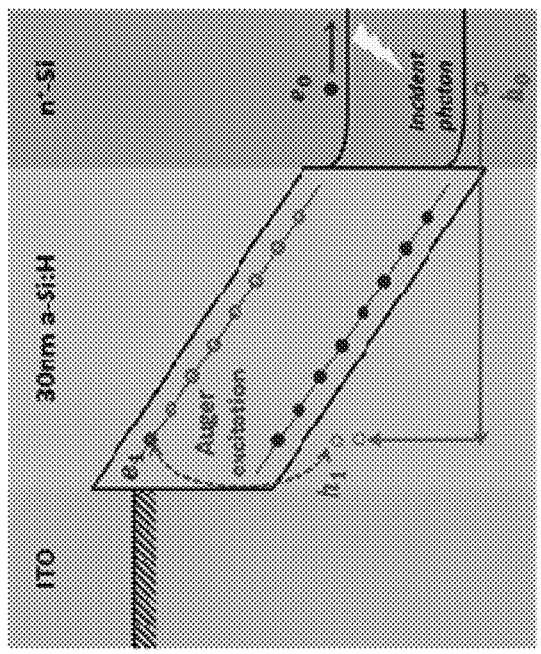
Figure 8D:
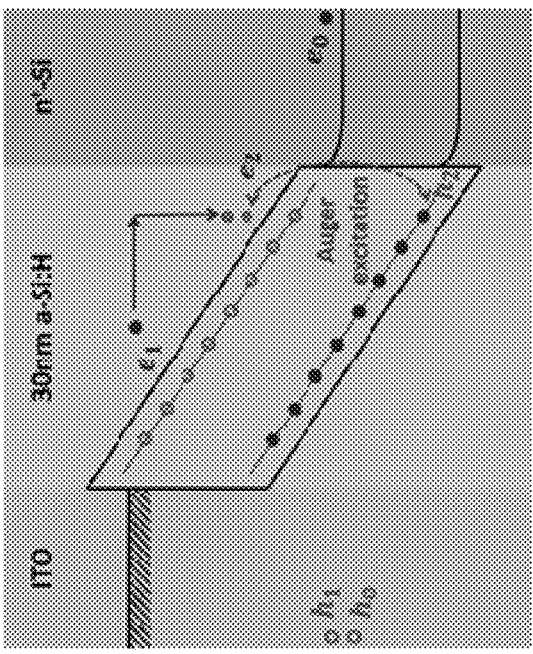

FIGS. 8A-8D show illustrative diagrams depicting an example cycling excitation process implemented by the CEP device 700. In FIGS. 8A-D, $e_i/h_i$ denotes the i-th generation electron/hole, the solid circles indicate electrons and their motion while the opened circles represent holes and their motion. The diagram of FIG. 8A shows an incident photon is absorbed by the n-type material layer (e.g., n+-Si substrate), creating an electron-hole pair and initiating an Auger process to excite a localized hole from a conduction bandtail state of the disordered material to the valence band. The diagram of FIG. 8B shows the localized electron transferred to the conduction band, e.g., by phonon absorption or field-assisted tunneling. The diagram of FIG. 8C shows the electron initiates an Auger process to excite a localized electron from the valence bandtail to the conduction band. The diagram of FIG. 8D shows the localized hole left in the valence band transferred to the valence band, e.g., by phonon absorption or field assisted tunneling.

FIG. 8A depicts that first step where an incident photon is absorbed at the substrate layer 713 creating a primary electron-hole pair. Primary electrons (solid circles) are then collected by the transparent electrode layer 710, and the primary holes (opened circles) enter the disordered material layer 711 and are subsequently energized by the electric field. Losing some kinetic energy by scattering, the energetic hole initiates an Auger process to excite a localized hole from a conduction bandtail state of the disordered material to the valence band, leaving a localized electron at that state. The photogenerated electron travels to the n-type semiconductor layer 712 (i.e., n$^+$-Si MESA), and the photogenerated hole moves towards the transparent electrode layer 711, e.g., crossing the disordered material layer 711. As the hole crosses the disordered material layer 711, it gains kinetic energy from the applied field and becomes an energetic hole, which excites another hole from a conduction bandtail state to the valence band and leaves a localized electron in that state.

FIG. 8B shows that following the Auger excitation, the localized electron can be transferred to the conduction band by phonon absorption or field-assisted tunneling. Meanwhile, the primary and excited holes are collected by the transparent electrode layer 710. As shown in FIG. 8C, the electron produced (shown in FIG. 8B) gains kinetic energy as it travels in the disordered material layer 711 and initiates an Auger process to excite another localized electron from a valence bandtail state to the conduction band, leaving a localized hole in the bandtail state.

FIG. 8D shows a step similar to FIG. 8B, where by phonon absorption or field-assisted tunneling, the hole, left in the localized bandtail state, can transfer into the valence band and start the subsequent cycle. At a given bias voltage, there is a certain probability for each cycle (e.g., steps one FIGS. 8A to 8D), giving rise to the observed photocurrent gain. Again, the localized hole can be transferred into valence band by phonon-absorption or field-assisted tunneling (FIG. 8D). In this manner, the amplification process occurs in cycles within the disordered material layer 711 which acts as a gain medium for the cycling excitation process.

From the example CEP process illustrated in FIGS. 8A-8D, it is apparent that the presence of high density of localized states in disordered material is a necessary to facilitate CEP. Yet, for some disordered materials, the structure of the material may not provide a sufficient condition for the CEP gain. For example, as shown in FIGS. 8A to 8C, each Auger excitation will leave an electron or hole in the localized state. Unless this localized electron or hole can also be excited to the conduction or valence band to become mobile, the cycle cannot continue and no substantial gain can be achieved. Therefore, in addition to an effective medium, the CEP process also needs an efficient mechanism to bring the localized carrier produced by Auger excitation to the mobile bands. There are two mechanisms to realize this process: phonon absorption and field-enhanced tunneling, which are illustrated in FIGS. 8B and 8D.

The efficiency for such processes depends on the strength of electron(hole)-phonon coupling and available population of phonons with sufficient energies for the process. For the former, the electron(hole)-phonon coupling can be greatly enhanced due to the localization of the electron(hole), an effect that can occur in disordered materials. For the latter, i.e., the available population of phonons, a CEP device can employ phonon engineered features to enhance the concentration of high energy phonons. One example of phonon engineering is obtained by creating a large thermal conductivity mismatch between the thin CEP layer (e.g., low thermal conductivity) and the next layers. In such case, phonons are more confined to the thin CEP layer, which enhances electron (hole) phonon coupling for higher gain. The example device 700 of FIG. 7A represents a simple yet effective design for such purpose. There is a large mismatch in thermal conductivity between the a-Si:H disordered material layer 711 and crystalline Si, indicating the presence of a phonon confinement structure where phonons are confined to the thin (e.g., 30 nm) a-Si:H disordered material layer 711 to be readily available for interaction with the localized electrons and holes. Another mechanism for escape of electron(hole) from a localized state to the mobile band is field-enhanced tunneling. Under high E-field, the effective barrier thickness for an electron in a localized state to tunnel into the mobile band is reduced, thus the probability or rate of tunneling increases.

The CEP process in disordered materials is not only highly efficient, manifested by the high gain under very low bias voltage, but also very fast. Due to the high efficiency, the thickness of gain medium (e.g., the disordered material responsible for signal amplification) can be 10× to 100× less than the multiplication region of a conventional avalanche detector based on impact ionization (e.g., about 30 nm to about 50 nm for CEP device, as compared to 500 nm to 5 μm for conventional APDs). A thin disordered material layer results in short carrier transit time in favor of high frequency operation.

The fact that devices made of disordered material-like amorphous silicon can be fast is anti-intuitive and unexpected. For example, it has been well established and understood that almost all disordered materials have extremely low carrier mobility (e.g., typically 1000 times lower than that of crystalline material), so any device using disordered material would be considered to be intrinsically slow. A prominent example is the sharp contrast in the speed of Si VLSI (very-large scale integration) circuits and amorphous Si thin-film transistor circuits. The former can be more than 10,000 times faster than the latter.

However, mobility is not a relevant parameter for CEP devices even though it is the most commonly used figure of merit to measure the speed of any electronic and optoelectronic devices. This is because CEP devices work in a very thin region (e.g., <50 nm) under high electric field (e.g., >1×10$^6$ V/cm), so the carriers (electrons and holes) are far from a steady state as compared to other devices made of disordered materials (e.g., a-Si for photovoltaics or display). Carriers in a disordered material can in fact gain sufficient kinetic energy since inelastic scatterings cannot relax the energy fast enough. The key for efficient CEP effect, however, is for an energetic carrier to have a high chance to create Auger excitation within a distance of a few nanometers. The extremely large number of localized states in a-Si:H disordered material, for example or other disordered materials, provides such an environment. Therefore, while thin-film transistors made of a-Si:H have poor performance compared to crystalline Si, electrons and holes can be accelerated and gain sufficient kinetic energy to trigger Auger excitation with localized electrons/holes very efficiently.

For the same token, in spite of the extremely low speed for a-Si:H thin film transistors (e.g., ring oscillator with propagation delay of μs versus CMOS ring oscillators with <100 ps delay), the CEP device such as those including a disordered material layer like that described herein (e.g., a-Si:H) have not only high gain and energy efficiency but also very high speed.

Example CEP Device Characteristics

DC Characteristics

Figure 9A:
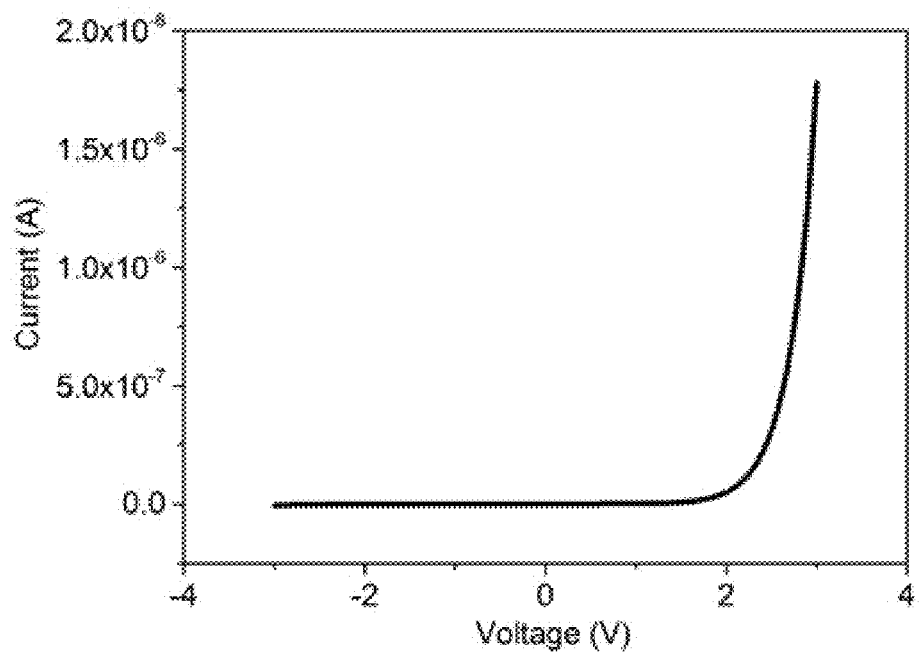
FIG. 9A shows a plot of the I-V characteristics of the example CEP device of FIGS. 1A-1D.

FIG. 9A shows the I-V characteristics the specific embodiment of the CEP device 700 shown in FIG. 7A. The device has the standard characteristic of a diode with a higher than usual forward bias voltage, e.g., due to a hole barrier of 1.2 eV between the indium tin oxide (ITO) transparent electrode layer 710 to the a-Si:H disordered material layer 711 and a 0.25 eV conduction band offset at the a-Si:H disordered material layer 711 to the n$^+$-Si substrate layer 713 interface. As shown in FIG. 9A, the example test results of CEP devices exhibited standard current-voltage characteristics of a diode. Under forward bias, the example photodiodes are turned on at about 2 V, e.g., due to a hole barrier of 1.2 eV from ITO to a-Si:H layer and a 0.25 eV conduction band offset at the a-Si:H to silicon interface.

Figure 9B:
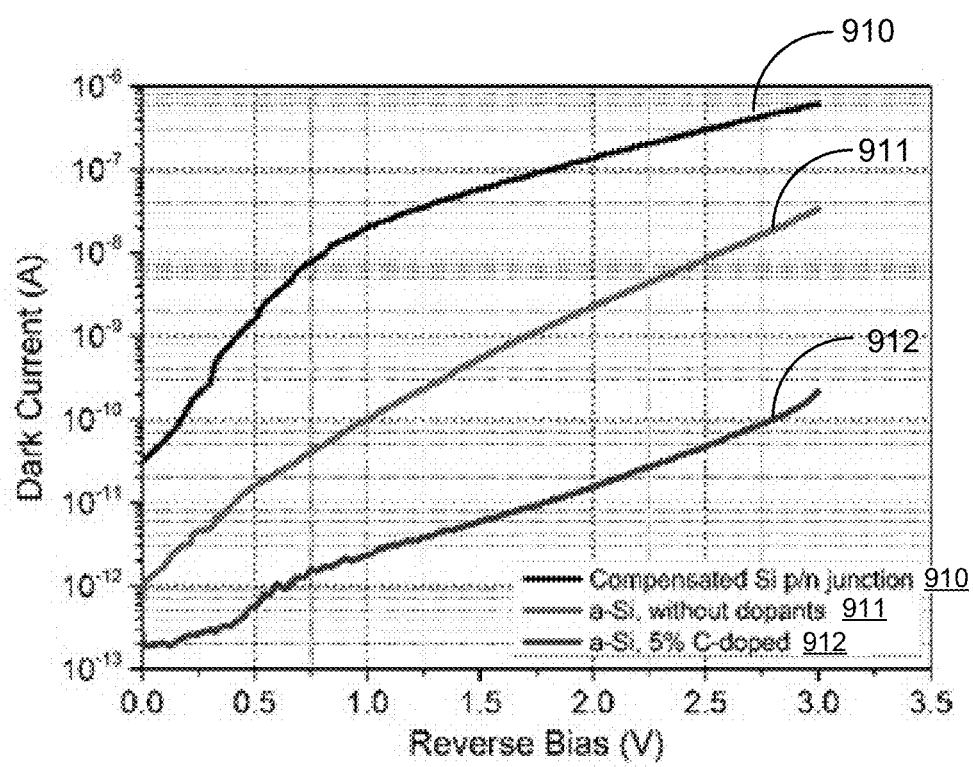
FIG. 9B shows a plot of the dark current vs reverse bias voltage plots for an example CEP device made of compensated silicon p/n junction.

FIG. 9B shows a comparative data plot depicting the dark current versus reverse bias voltage for various embodiments of the CEP device 100. The examples include CEP devices where the disordered material layer includes a Si p/n junction material (shown in plot 910), a 30 nm undoped a-Si:H material (shown in plot 911), and a 30 nm 5% C-doped a-Si:H material (shown in plot 912). All three example devices have the same structure and size. The compensated Si p/n junction material (plot 910) has the highest dark current, mostly due to high tunneling currents. The a-Si:H material (plot 911) shows much lower dark current because of its higher bandgap which suppresses tunneling. Doping the a-Si:H material with ~5% carbon further suppresses the dark current by more than three orders of magnitude. At −3V bias, the dark current density of 5% C-doped a-Si:H (plot 912) is about 22 μA/cm$^2$.

Figure 9C:
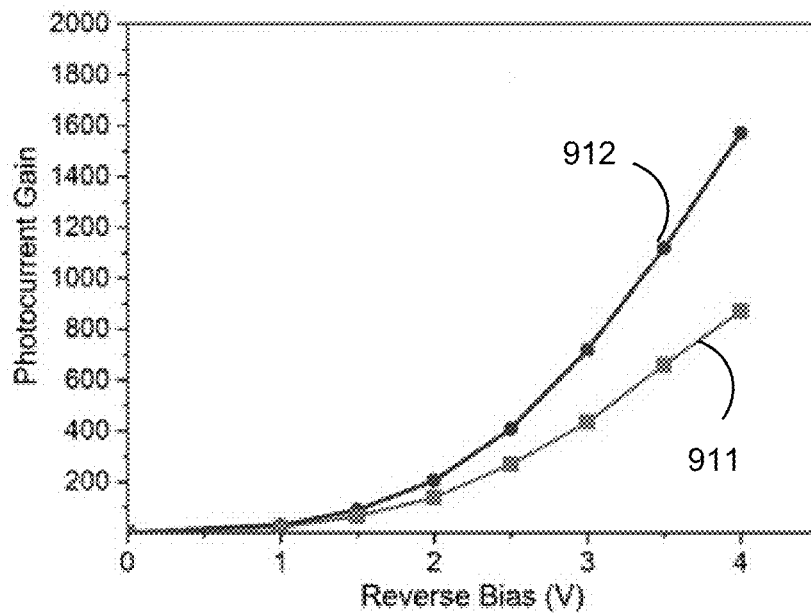
FIG. 9C shows a plot of the photo-current gain for an example intrinsic CEP device.

FIG. 9C shows a comparative data plot depicting the DC photocurrent gain of an example embodiment of the example CEP device 100 where the disordered layer material includes a C-doped a-Si:H material (shown in plot 912) and an intrinsic a-Si:H material (shown in plot 911). Both the C-doped a-Si:H material and the intrinsic a-Si:H material have a 30 μm diameter photosensitive area. Unity gain is referred to zero bias photocurrent having only the built-in field in the CEP medium (e.g., disordered material layer responsible for the CEP effect).

The example CEP devices including the C-doped a-Si:H material and the intrinsic a-Si:H material were tested under 405 nm light with a diode laser as the same light source. The unity gain is obtained from the ratio of photocurrent under a given bias voltage and photocurrent under zero-bias where only the built-in field is present in the CEP medium. Dividing the zero-bias photocurrent (e.g., primary photocurrent) by the laser power reaching the active area of the device yields the responsivity at zero bias. The external quantum efficiency of the CEP device where the disordered layer material includes C-doped a-Si:H material is between 7.6% and 18% at 405 nm wavelength. To probe the intrinsic properties of the CEP effect in the CEP device where disordered layer material includes intrinsic a-Si:H material, the device was characterized at 405 nm wavelength to take advantage of the shallow absorption region (e.g., <100 nm), avoiding the effect of carrier diffusion by those photo-excited carriers in that n$^+$-Si substrate for this example embodiment.

High Frequency And Noise Characteristics

Figure 10:
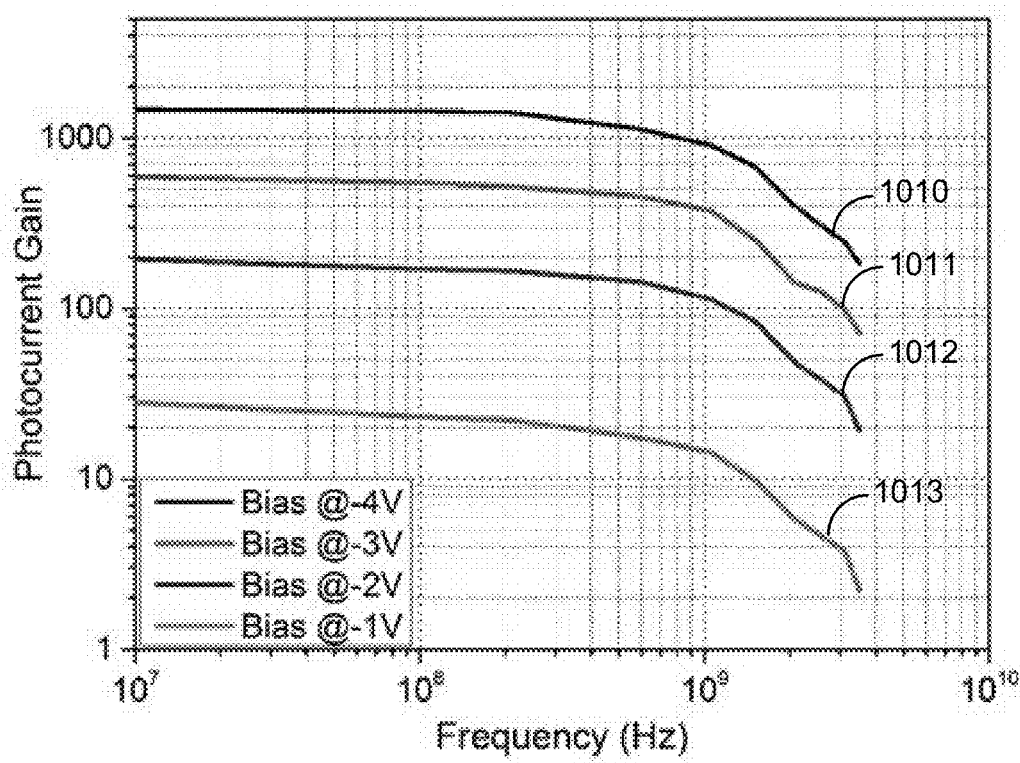
FIG. 10 shows a plot of the frequency dependence of gain for an example CEP device.

FIG. 10 shows a data plot depicting the frequency dependence of photocurrent gain for an example embodiment of the CEP device 100, e.g., in which the disorder layer material includes a C-doped a-Si:H material, under different bias voltages, including at a 4 V bias (shown in plot 1010), at a 3 V bias (shown in plot 1011), at a 2 V bias (shown in plot 1012), and at a 1 V bias (shown in plot 1013). The plot shows the AC photocurrent gain versus the laser power modulation frequency plotted under the four different reverse bias voltages. Low frequency (e.g., below 10 MHz) gains are close to DC gain values. The 3 dB cutoff frequency is about 1.5 GHz. Above 1.5 GHz, the AC gain decreases at a rate of around 20 dB/decade. The photocurrent gain drops to half of its low frequency value at 1 GHz to 1.5 GHz under all bias voltages between 1 V (plot 1013) and 4 V (plot 1010).

For example, since the cutoff frequency for photocurrent gain is almost independent of the bias voltage, it is likely that the cutoff frequency is due to RC roll-off instead of intrinsic frequency limit of the cycling excitation process in a CEP device where the disordered layer material is includes C-doped a-Si:H. Even so, for example, a conservative estimate of the gain-bandwidth product can be determined by taking 1.5 GHz as the intrinsic bandwidth and a gain of 1500 under 4 V bias. This yields a gain-bandwidth product of at least 2.25 THz for the CEP device where the disordered material layer is includes of C-doped a-Si:H. In this example embodiment, the CEP device with a disorder material layer including C-doped a-Si:H is considered to have the highest gain-bandwidth product among any known solid-state devices.

Besides gain-bandwidth product, excess noise factor is another important figure of merit for any amplification mechanism in photodetectors. The excess noise factor is defined as $F=1+\sigma_M^2/M^2$, where M is the average value of gain and $\sigma_M$ is the standard variation of the gain, a measure of the fluctuation of the amplification process. For an ideal amplifier, for example, the excess noise factor increases to 2.0 as gain approaches infinity. However, the excess noise factor for a practical avalanche photodetector (APD) is usually far greater than 2.0 under high gain.

Figure 11:
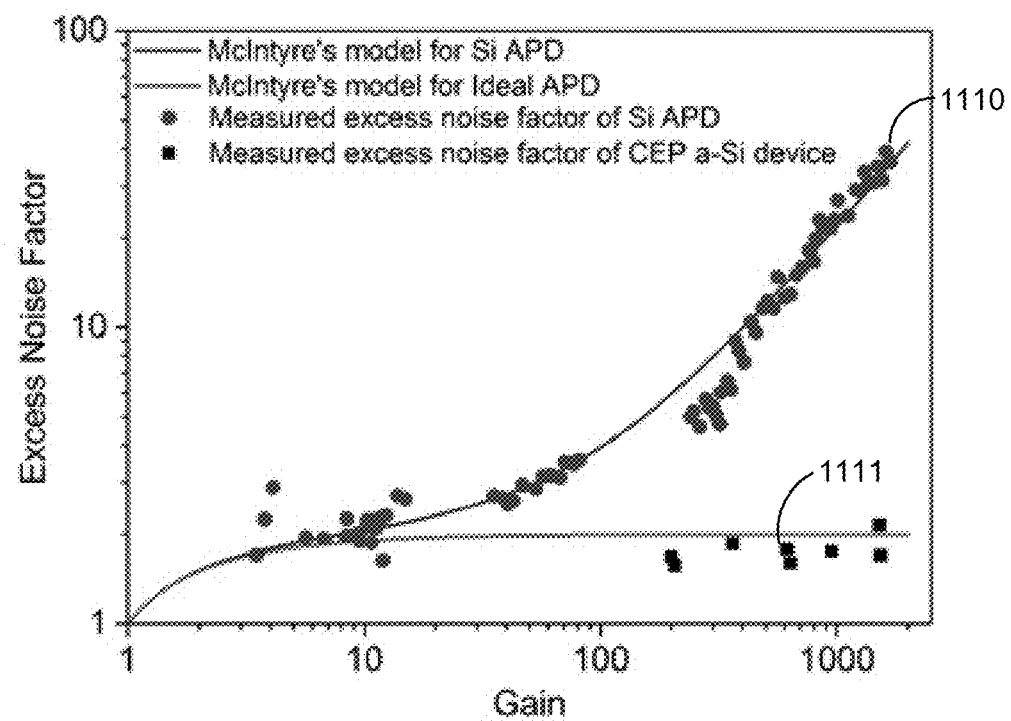
FIG. 11 shows a plot of the excess noise factor dependence on gain for an example CEP device.

FIG. 11 is shows a data plot showing the excess noise factor dependence on gain for a commercial Silicon APD device (shown in plot 1110, shown in discrete squares) and an example C-doped a-Si:H CEP device (shown in plot 1111, shown in discrete circles). The measured excess noise factor for the commercial Si APD agrees well with McIntyre's model (shown by the curve that flows the discrete circles). On the other hand, the excess noise factor of the C-doped a-Si:H CEP is close to the curve (that follows discrete squares) of an ideal detector (e.g., close to the noise properties for an ideal photocurrent amplifier) with minimum fluctuations of gain or the lowest noise. The measured excess factor of the C-doped a-Si:H CEP device is 1.91 at a gain of 1526, which is more than 17 times lower than the commercial Si APD at the same gain.

Photon Counting Characteristics

Figure 12A:
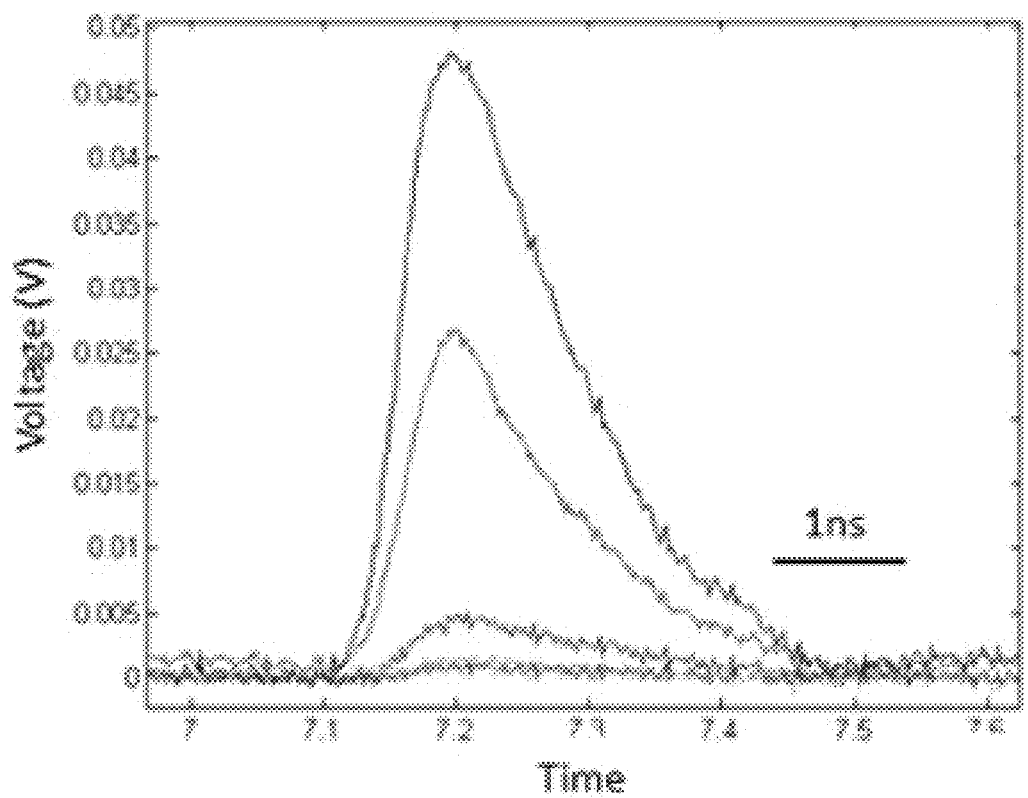
FIG. 12A shows a plot of the output for the example CEP device in response to an optical pulse containing a different number of photons where the signal is displayed on the oscilloscope.
Figure 12B:
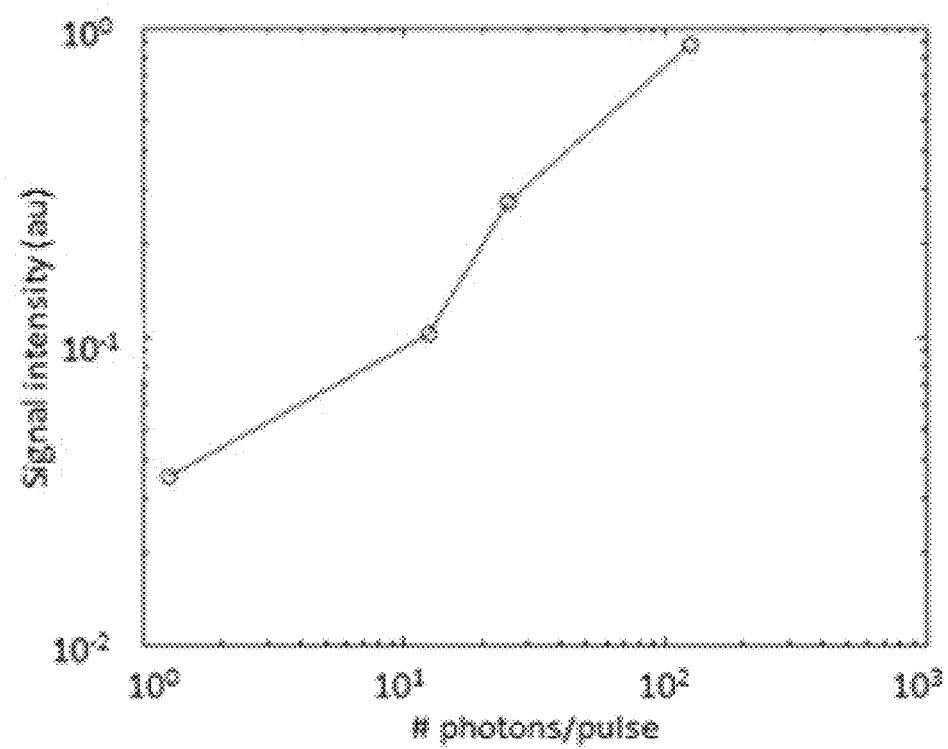
FIG. 12B shows a plot of the output for the example CEP device in response to an optical pulse containing a different number of photons where the CEP output signal is a function of the average photon number in each optical pulse.

FIGS. 12A and 12B show plots for an example CEP device 100 that, in this example embodiment, has disordered material layer comprised of a-Si:H CEP that exhibits single photon sensitivity under room temperature, continuous mode (i.e., non-gated mode) operation. FIG. 12A shows a plot of output versus the number of photons within the optical signal for a CEP device. In this specific example, a 375 nm wavelength pulsed diode laser is used as the light source. The diode laser produces an optical pulse of ~40 ps pulse width at a repetition rate of 1 MHz. The a-Si:H device is biased at 4 V to 5 V through a bias-T circuit. The pulsed photocurrent from the CEP detector is amplified by an external amplifier, and the output is displayed on an oscilloscope.

The data plot of FIG. 12B shows that, in this example embodiment, the CEP device output increases monotonically with the number of photons within each optical pulse, indicating that the device not only has high sensitivity but also a wide dynamic range with the potential to resolve the number of photons in each pulse.

For these examples, it is noted that since a-Si:H layer is deposited by PECVD at 270° C., the process is compatible with not only CMOS but also a large variety of electronic platforms such as flexible polymeric substrate and other substrates including III-V, II-VI, IV-IV compound semiconductors as well as glass, quartz, etc.

Example a-Si Photodiode Devices with 2 THz Gain-Bandwidth Product

Described below are example embodiments and implementations of the CEP device 100 for an amorphous silicon photodiode with 2 THz gain-bandwidth product based on cycling excitation process.

In some embodiments, the CEP device includes a disordered material layer that includes amorphous silicon (a-Si). For example, due to bonding and topological disorder, amorphous silicon has long bandtails of localized states which also have strong electron phonon interaction. However, there are also deep states within its bandgap due to structural defects and dangling bonds. Although the deep states are also localized states, they are too deep to be excited by phonons and rely on field enhanced direct/indirect tunneling to move the localized carriers to the mobile bands. Therefore, the amorphous silicon was treated with hydrogen plasma to passivate the dangling bonds of Si with H atoms to control the density of those deep states, producing hydrogenated amorphous silicon disordered material for example CEP devices in accordance with the present technology. In some embodiments, a small percentage of carbon (e.g., ~5%) was introduced into hydrogenated amorphous silicon (a-Si:H) to increase the level of disordering and to tailor the phonon energy and strength of electron-phonon coupling. This approach, for example, has enabled the design and fabrication of devices with a 30 nm Carbon-doped (C-doped) a-Si:H disordered material for CEP devices. Some example embodiments include the C-doped a-Si:H disordered material configured between a top ITO contact and an $n^+$-Si substrate. An example of such a CEP device is depicted in FIG. 7A as device 700, where the disordered material layer 711 includes the C-doped a-Si:H disordered material.

Figure 13:
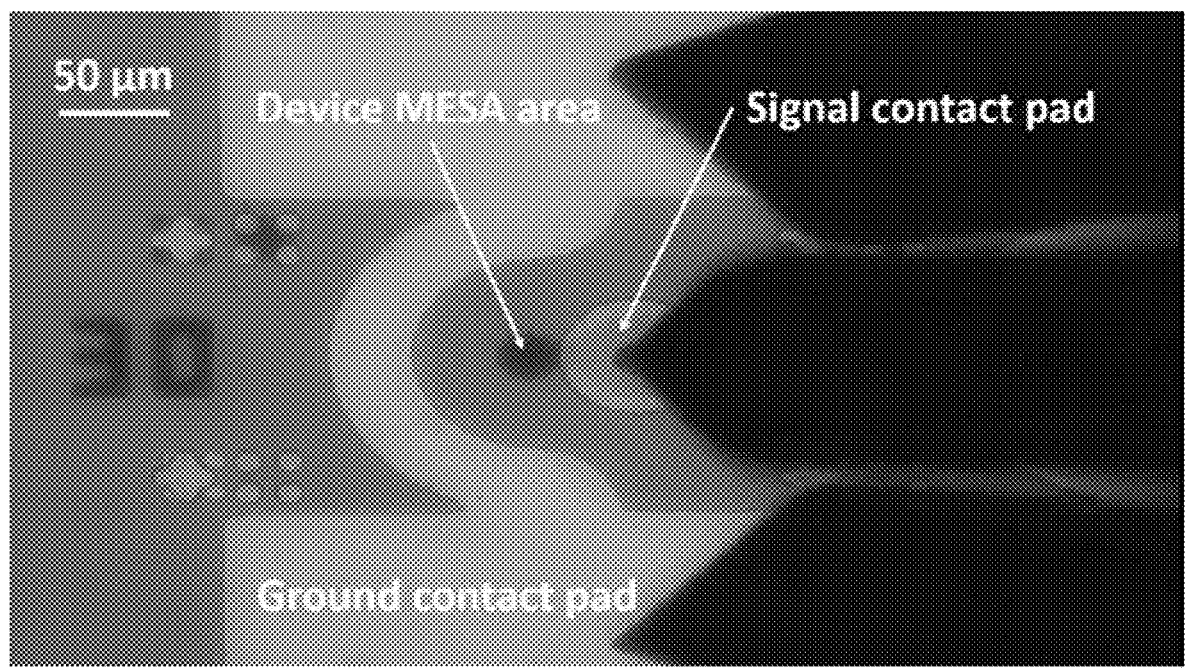
FIG. 13 shows a micrograph of the example device of FIG. 7A.

FIG. 13 shows an image of this example device, showing a top view of a 30 m-diameter CEP device with a Ground-Signal-Ground (GSG) probe for high-speed measurements. In this example, the contact pad is isolated from the substrate by a 200 nm thick silicon dioxide layer. The device mesa other than the photosensitive area (e.g., 30 μm diameter circle) was covered by a 150 nm thick chromium/gold layer so that the incident light can only illuminate the active area.

The CEP effect can take place within a very thin layer of (carbon-doped) a-Si. Contrary to conventional wisdom, the low carrier mobility (e.g., ~2 $cm^2$/V-s) of a-Si does not affect efficient acceleration of carriers to produce energetic carriers required for Auger excitation. The mobility of a-Si is valid for low field and relatively large length. In the regime of high field (e.g., ~$10^6$ V/cm) and short distance (e.g., 30 nm), carriers in a-Si can gain sufficient kinetic energy as all inelastic scatterings cannot relax the energy fast enough. For example, a key aspect for efficient CEP effect is for an energetic carrier to have a high chance to create Auger excitation within a distance of a few nanometers. The extremely large number of localized states in a-Si provides such an environment.

As previously shown in FIGS. 8A-8D, an energetic hole excites a hole from a conduction bandtail state to the valence band (or equivalently, excite an electron from the valence band to occupy a conduction bandtail state). Following Auger excitation, a localized electron is created and is subsequently transferred to the conduction band (FIG. 8B) by absorption of a phonon or by field-enhanced tunneling. Similarly, the conduction band electron created in the above process can be accelerated and trigger another Auger excitation, giving rise to an electron in conduction band and a localized hole in the valence bandtail (FIG. 8C). Again, the localized hole can be transferred into valence band by phonon-absorption or field-assisted tunneling (FIG. 8D). In this manner, for example, the amplification process occurs in cycles within a 30 nm thin a-Si layer. The ultrathin disordered material layer reduces the timing uncertainty and consequently, excess noise of the device.

The example CEP device including the C-doped a-Si:H disordered material layer can amplify current using the CEP effect, in which the device exhibits a gain-bandwidth product of over 2 THz and a low excess noise factor of 1.9. These desirable characteristics are achieved with extremely simple device structure and low-mobility material. On the premise of the described physics for cycling excitation process, many other disordered materials including polymers may also be used to produce CEP photodetectors, opening new avenues for applications involving optical-to-electric signal conversion.

Example Device Fabrication Techniques

An example fabrication technique to produce CEP devices is described. For example, a CEP device that includes an amorphous silicon disordered material can be produced as follows. A amorphous silicon (a-Si) layer (e.g., 30 nm thick) can be grown onto a substrate (e.g., an n+ (100) silicon substrate) using a deposition technique, e.g., such as PECVD at a chamber substrate temperature of 270° C., with the addition of silane ($SiH_4$) at a flow rate of 450 sccm. In some implementations, fabrication of a 5% carbon doped a-Si disorder material layer for the CEP device can include providing silane at a flow rate maintained at 450 sccm and methane ($CH_4$) at a flow rate of 24 sccm onto the n+ (100) silicon. Right after the a-Si growth, the sample can be treated with $H_2$ plasma to passivate dangling bonds and surface states. Also by PECVD, a 200 nm thick silicon dioxide ($SiO_2$) layer can be grown onto the a-Si:H layer. A $1^{st}$ step photolithography can be performed with photoresist patterns, followed by lift-off of 150 nm thick Cr/Au layer formed by sputtering. After metal lift-off, the Cr/Au patterns are used as etch masks for BOE etch of the $SiO_2$ layer. The Cr/Au patterns are then used for both device contact and light blocking over regions outside the active areas. A 2nd step photolithography can be performed to define the ITO patterns by lifting off the 200 nm thick sputtered ITO layer. The ITO layer is annealed (e.g., at 300° C.) for a time period (e.g., one minute) and then used as etch mask to form 200 nm device mesas by plasma etch. A 3rd step photolithography can be conducted to form metal contact on the n+-Si, e.g., with a 200 nm thick sputtered Ti/Au layer. Finally, the sample is annealed (e.g., at 300° C.) for a time period (e.g., one minute) in a rapid thermal annealing chamber.

Examples implementations of the example C-doped a-Si:H CEP devices were conducted to investigate device I-V response, DC photocurrent gain, responsivity, gain bandwidth product, noise and other characteristics, which are discussed below.

Direct I-V Characteristics and DC Photo-current Gain

In the example implementations, device photocurrent was measured using a precision source meter, Agilent B2912A. To determine the DC gain of a-Si CEP photodiodes, for example, the photocurrent at zero voltage bias was measured under different laser power at 405 nm wavelength and bias voltage. At zero bias, the built-in field in the a-Si:H layer was around $8×10^4$ V/cm. The zero-bias photocurrent was defined as primary photocurrent. Under each DC bias, the photocurrent gain was calculated from the ratio of photocurrent, obtained by subtraction of total current from dark current, to the primary photocurrent.

Responsivity

Dividing the primary photocurrent by the laser power impinging upon the device active area provides a device responsivity. The measured responsivity was calibrated against two factors: the ITO reflectance and laser beam spot. The 0 V responsivity of carbon-doped a-Si devices falls between 0.025 A/W and 0.06 A/W at 405 nm, corresponding to a quantum efficiency between 7.6% and 18%.

Gain Bandwidth Product

The AC gain was measured in two frequency regimes. From 100 kHz to 300 MHz, the 405 nm laser diode was directly modulated as the 405 nm laser diode has an amplitude modulation bandwidth of 300 MHz. In the frequency regime from 100 MHz to 10 GHz, the power spectrum of the device impulse response using a 40 ps pulsed laser and an RF spectrum analyzer was measured. The gain between 100 MHz and 300 MHz measured from both methods (e.g., direct amplitude modulation and spectrum of impulse response) was set to be equal, hereby a calibrated frequency response of photocurrent gain from 100 KHz to 10 GHz was obtained. The DC and AC photocurrent gain at 100 KHz were compared to assure consistency of the results over very low frequency range.

Excess Noise Factor

The excess noise factor of the devices was measured as a function of photocurrent gain. The device under test was voltage biased through a bias tee. A 405 nm wavelength CW diode laser was used to illuminate the device. The AC component of the device photocurrent (which is the noise of the photodiode in this case) was measured using the noise function of a spectrum analyzer (Agilent N9020A). The noise power density was obtained at 70 MHz, a frequency well above the 1/f noise regime. Careful system calibration and data processing was carried out to remove relative intensity noise and added amplifier noise. The noise of a commercial Si APD and a-Si CEP device were then measured at various bias voltages. With the known relation between photocurrent gain and bias voltage, the excess noise factor (F) was then obtained as a function of gain.

Example Device Design and Structure

Figure 14A:
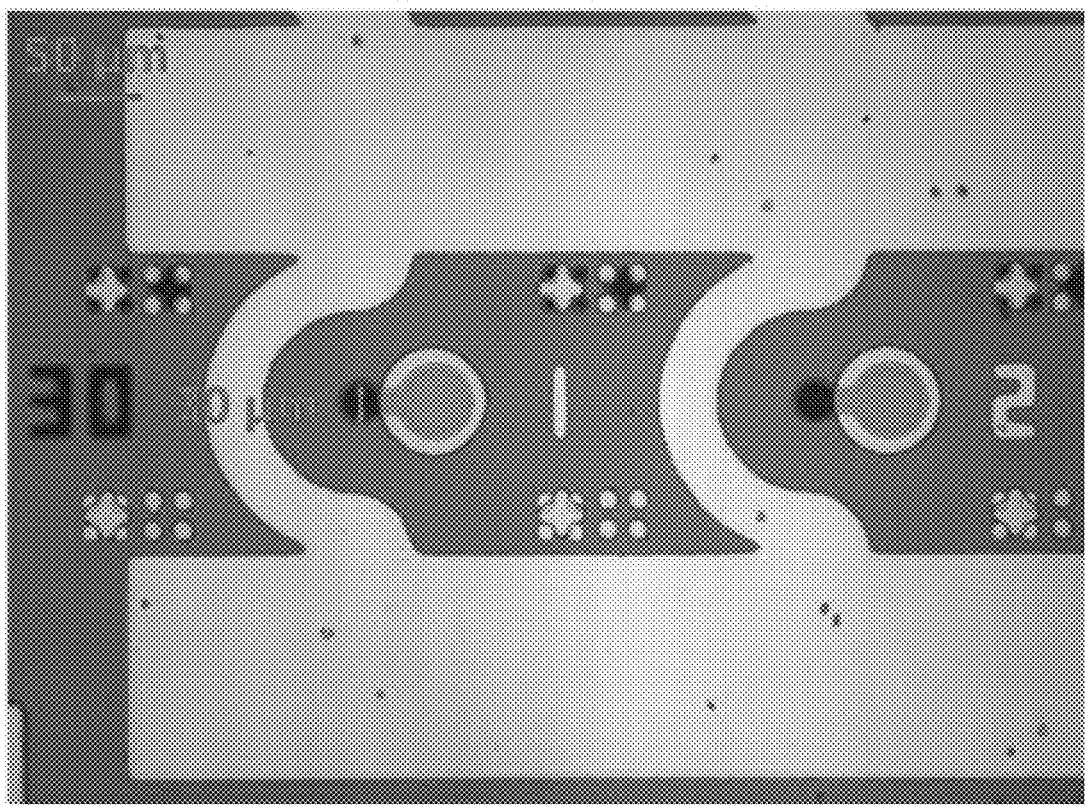
FIGS. 14A and 14B show micrographs of the example device of FIG. 7A.
Figure 14B:
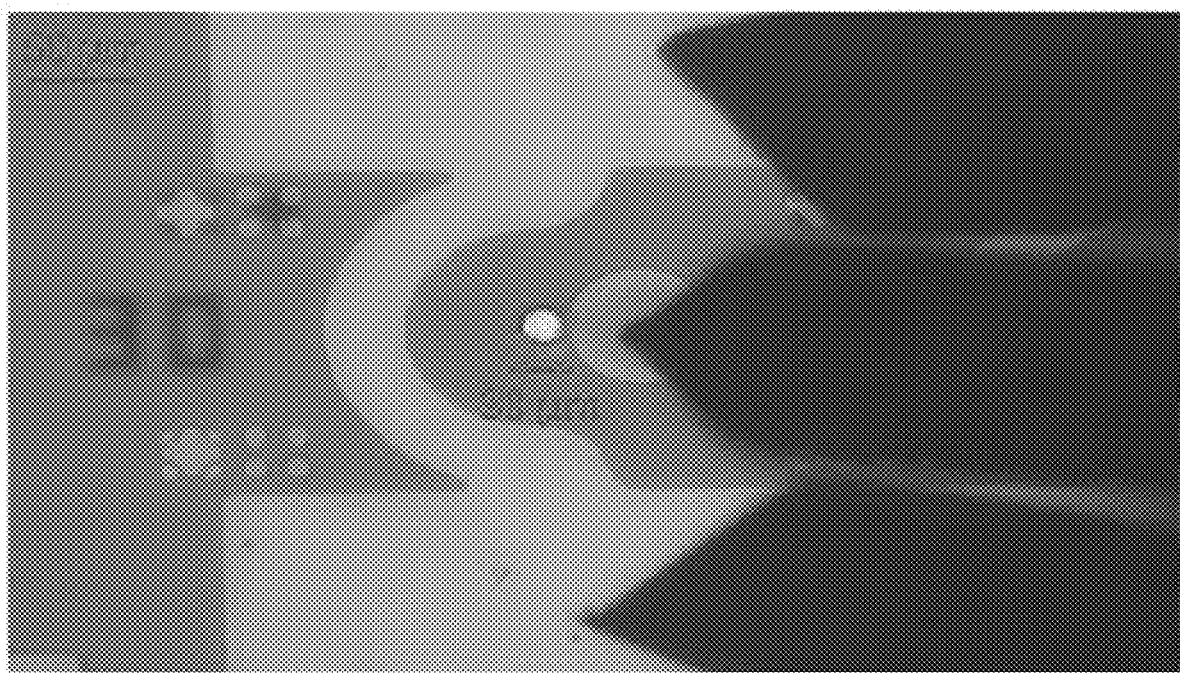

FIG. 14A shows a top view of an example of a fabricated 30 µm-diameter CEP device 700, imaged under a 20× objective, is shown in FIG. 14A. To better illustrate the characterization the devices, FIG. 14B shows the device with a high-speed Ground-Signal-Ground (GSG) probe in contact with the device 700 as shown in FIG. 14A. Furthermore, the beam spot of the 405 nm wavelength laser is tuned to match the size of this 30 m-diameter device.

Figure 15:
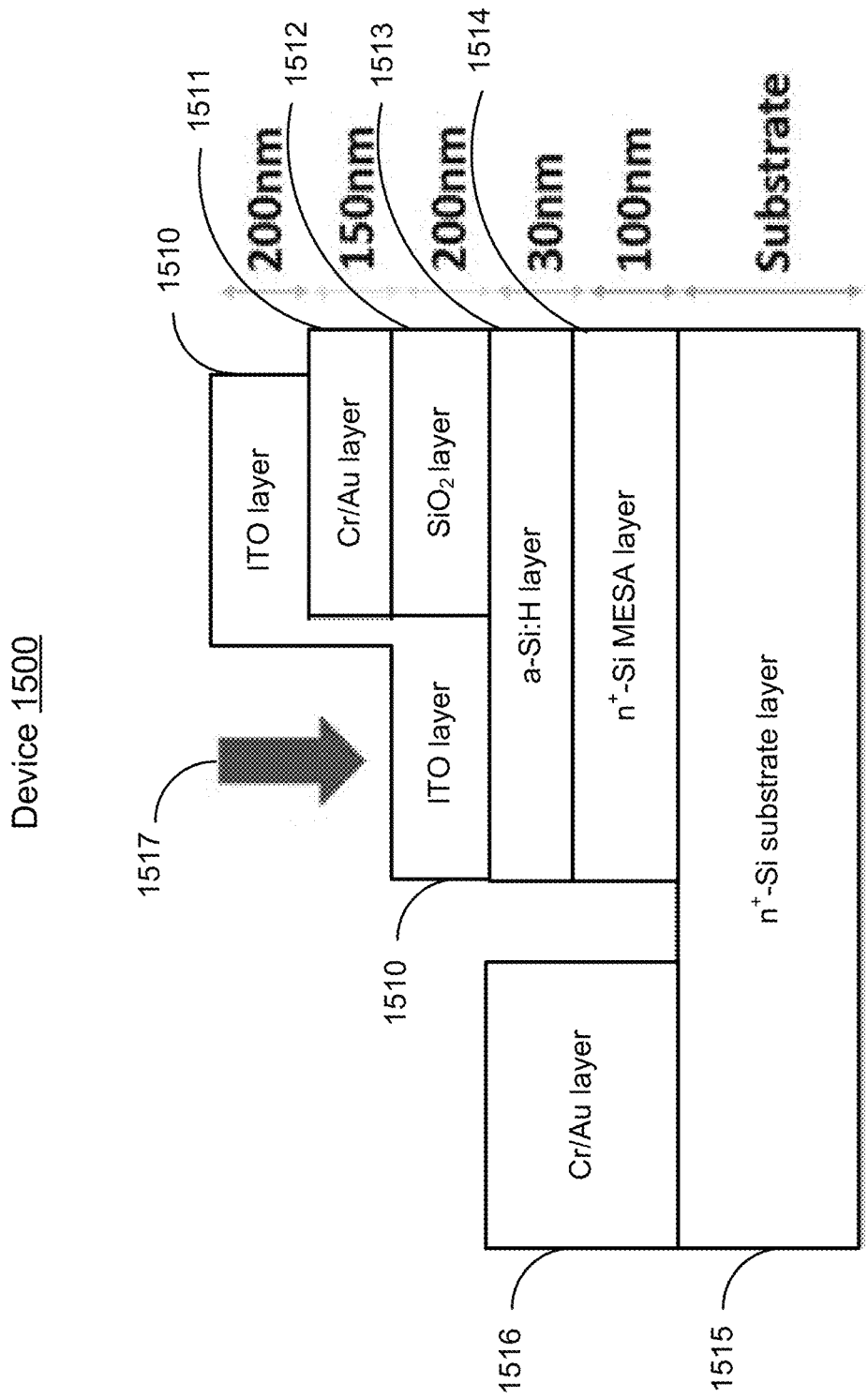
FIG. 15 shows a diagram of an example embodiment of the device of FIG. 7A.

FIG. 15 shows a diagram with an example embodiment of the CEP device 700, labeled device 1500 in the diagram. The example device 1500 includes a 200 nm thick indium tin oxide (ITO) transparent electrode layer 1510 that is coupled to a Cr/Au contact pad layer 1511. A SiO$_2$ layer 5112 is then coupled to the Cr/Au coupled layer. A 30 nm thick hydrogenated amorphous silicon (a-Si:H) disordered material layer 1513 is coupled to a 200 nm thick silicon dioxide (SiO$_2$) layer 1512 on one side and on the other side is coupled to n$^+$-Si MESA n-type semiconductor layer 1514. For example, the mesa defines the photosensitive area and the top contact electrode, and another electrode can be formed on the bottom of the mesa. The n$^+$-Si MESA n-type semiconductor layer is coupled to a 100 nm thick, highly doped n$^+$-Si substrate layer 1515 which is further coupled to a Ti/Au contact pad layer 1516. The arrow 1517 represents incident light to be absorbed and amplified through the CEP mechanism in implementations of the device 1500. In example implementations of the device 1500, the mesa other than the photosensitive area (e.g., 30 m-diameter circle) was covered by 150 nm thick chromium/gold (Cr/Au) contact pad layer 1511 is 150 nm thick, e.g., so that the incident light can only illuminate the active area. The Cr/Au contact pad layer 1511 is isolated from the substrate by a thick silicon dioxide (SiO$_2$) layer 1512, e.g., 200 nm thick.

CEP Gain and Experiment Setup

Figure 16:
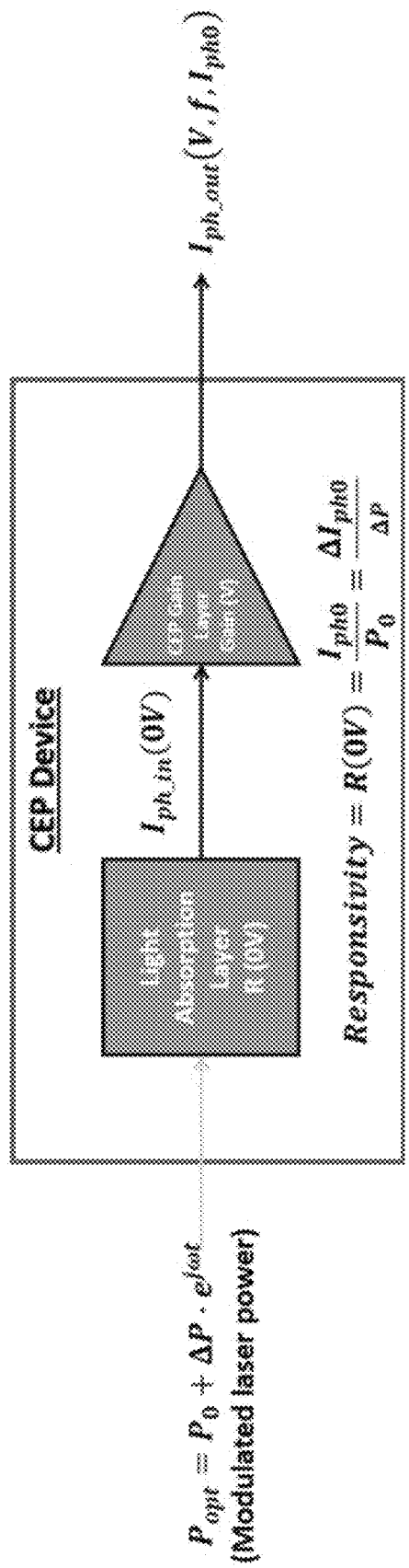
FIG. 16 shows a schematic diagram of CEP gain and experimental setup for implementations of example CEP devices.

FIG. 16 shows an illustration depicting CEP gain. The arrow on the left indicates the input optical signal which is the Continuous Wave (CW) or intensity modulated laser power into the device. The light is absorbed and transferred into photocurrent with a responsivity at 0 V bias, which gives a built-in field of around 10$^5$ V/cm in the a-Si:H layer. This is called the primary photocurrent. Then the primary photocurrent is further amplified by CEP gain as the device is reverse biased. The arrow on the left represents electrical signal.

After the optical power is absorbed, it is transferred into the primary photocurrent that has two components, the DC part, I$_{ph0}$, and an AC part ΔI$_{ph0}$. Such that:

$$I_{ph\_in}(0V) = I_{ph0} + \Delta I_{ph0} \cdot e^{jwt}$$

Amplified by the CEP gain under different reverse bias voltages, the output photocurrent can be presented as, $$I_{ph\_out}(V, f, I_{ph0}) = I_{ph} + \Delta I_{ph} \cdot e^{jwt}$$

Hence, the DC and AC gain of CEP can be defined as, $$G_{DC}(V) = \frac{I_{ph}(V)}{I_{ph}(0V)} = \frac{I_{ph}}{I_{ph0}} \quad (1)$$

$$g_{ac}(V, f, I_{ph0}) = \frac{\Delta I_{ph}}{\Delta I_{ph0}} \quad (2)$$

Figure 17:
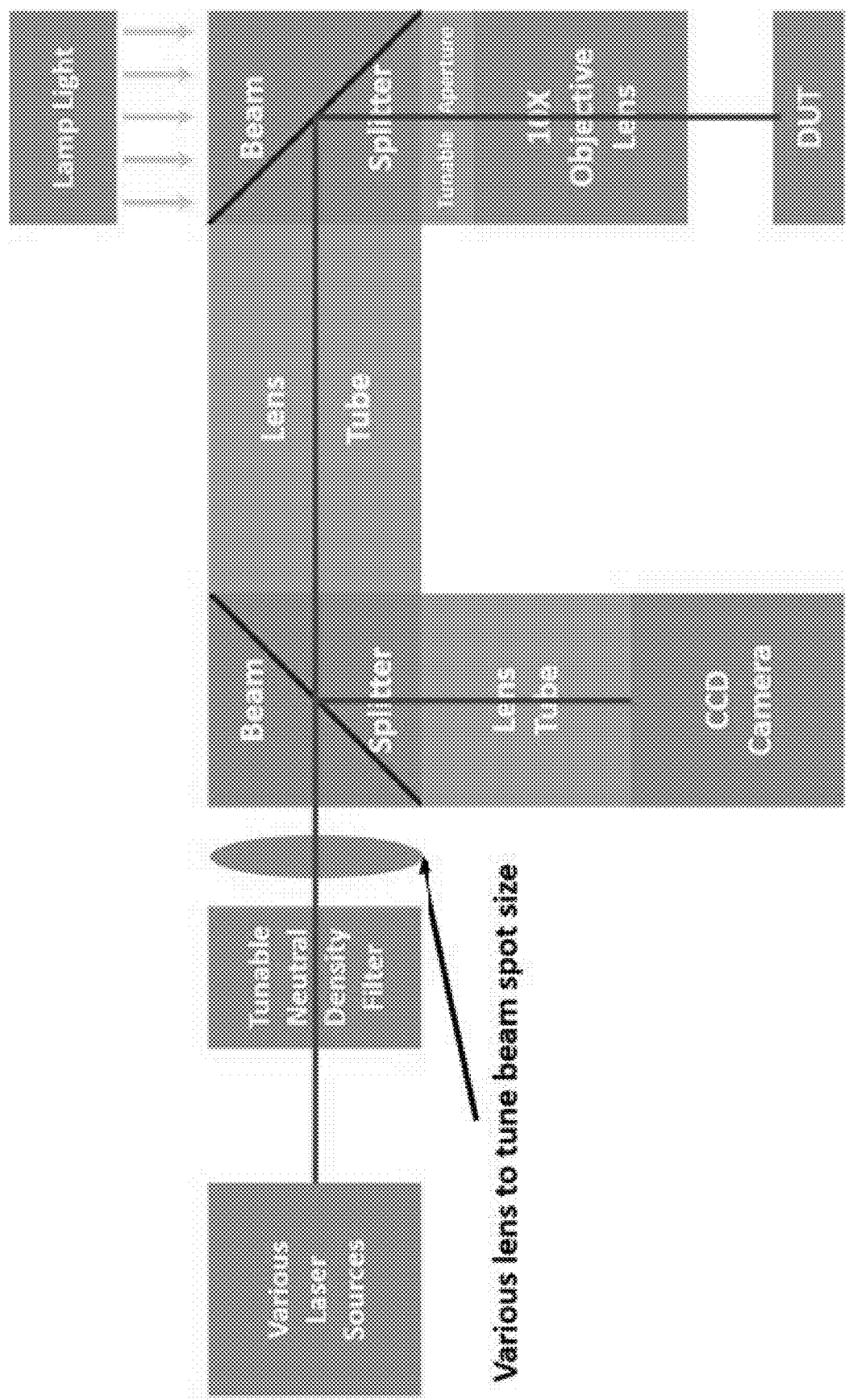
FIG. 17 shows a schematic diagram for the experimental setup for measuring the photoresponse of the example CEP devices.

FIG. 17 shows a diagram depicting an experimental setup used to measure the photoresponse of an example of the CEP device 100, such as the device 700. By using two beamsplitters in the setup, both signal laser light and illuminating lamp light can be coupled onto the device under test (DUT), which allows for an image the device and laser beam spot at the same time. As a result, size, shape, as well as the position of the beam spot can be visualized and adjusted. Moreover, there is a tunable neutral density filter in the setup to that allows for attenuation of the laser power to achieve power dependence of the device photo response. The lens in front of the beam splitter together with the tunable aperture, are used to change the laser beam size. For example, by adjusting the laser position relative to the system, the laser beam spot size can be further tuned.

Calibration of ITO Reflectivity at 405 nm

In the example implementations, the responsivity was calculated by the ratio of the primary photocurrent and the laser power under the objective lens, measured by a commercial large area photodetector. For the example implementations, two factors need calibration, the laser beam spot mismatch and ITO reflectance, to measure the device intrinsic responsivity.

Figure 18A:
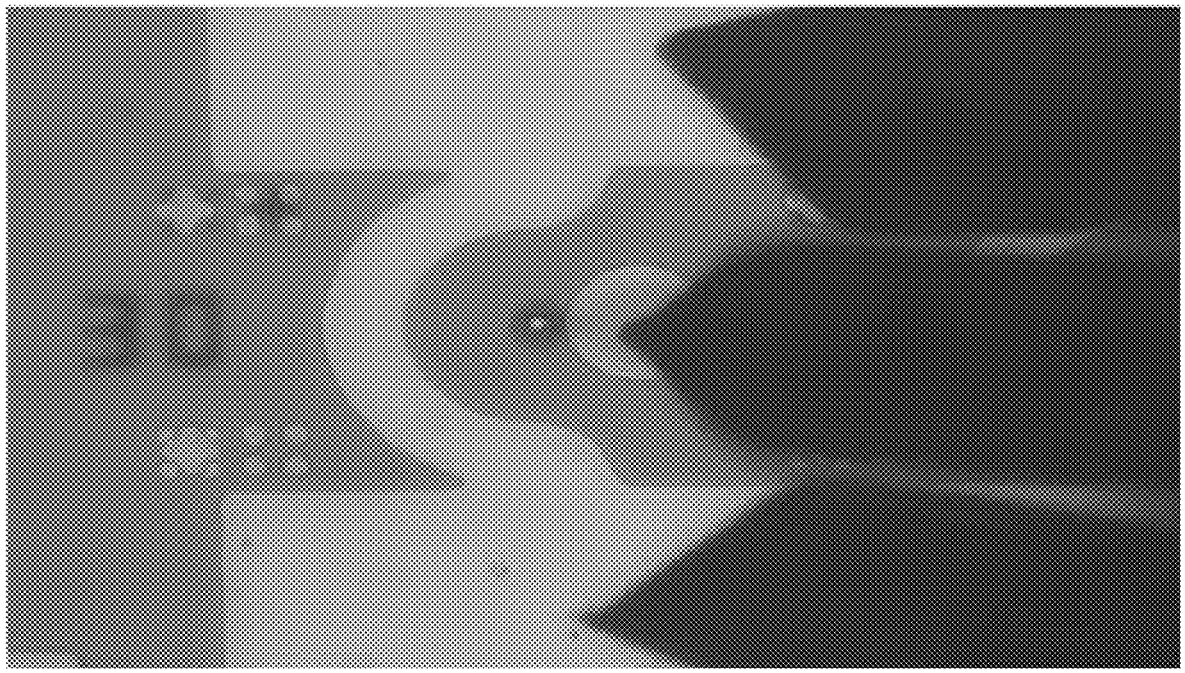
FIGS. 18A and 18B show micrographs of an example CEP device and the laser beam spot size as a function of the laser power.
Figure 18B:
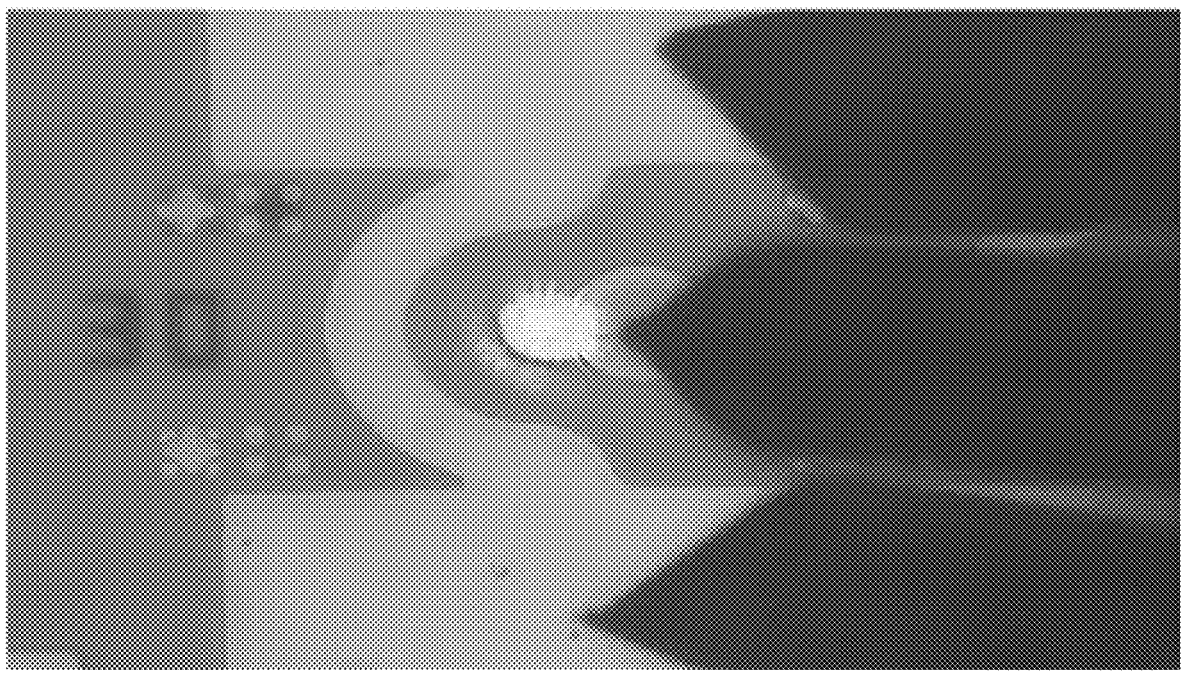

FIGS. 18A and 18B show micrographs of an example CEP device and the laser beam spot size as a function of the laser power. Due to the limited dynamic range of the CCD camera, for example, the laser beam spot size can appear to be different under different laser power. A small laser beam spot is obtained under low laser output power where the camera is not saturated, as shown in FIG. 18A, but the measurement error from the large-area commercial detector can become quite large. On the other hand, when the laser power increases to produce reliable power reading by the commercial detector, the measured beam spot becomes larger than its actual full-width-half-maximum (FWHM) value due to saturation of the CCD camera, as shown in FIG. 18B. Either of the above situations can affect the accuracy of the measurement. Therefore, the laser power must be adjusted to an optimal level, as shown in FIG. 14B, so that the laser beam size is smaller than the device active area without saturating the CCD camera and there is an adequate amount of laser power incidence to allow accurate power measurement by a commercial detector.

For example, there may exist some power loss due to reflection and absorption of laser light by the thin ITO layer. The bandgap energy of ITO is about 3.5 eV to 4.3 eV depending on the deposition condition. At 405 nm wavelength (e.g., 3.06 eV photon energy), the absorption by a 200 nm ITO thin film is much smaller than the reflection. Hence, only the ITO reflectance is calibrated to give a better estimation of the intrinsic device responsivity and quantum efficiency.

Figure 19:
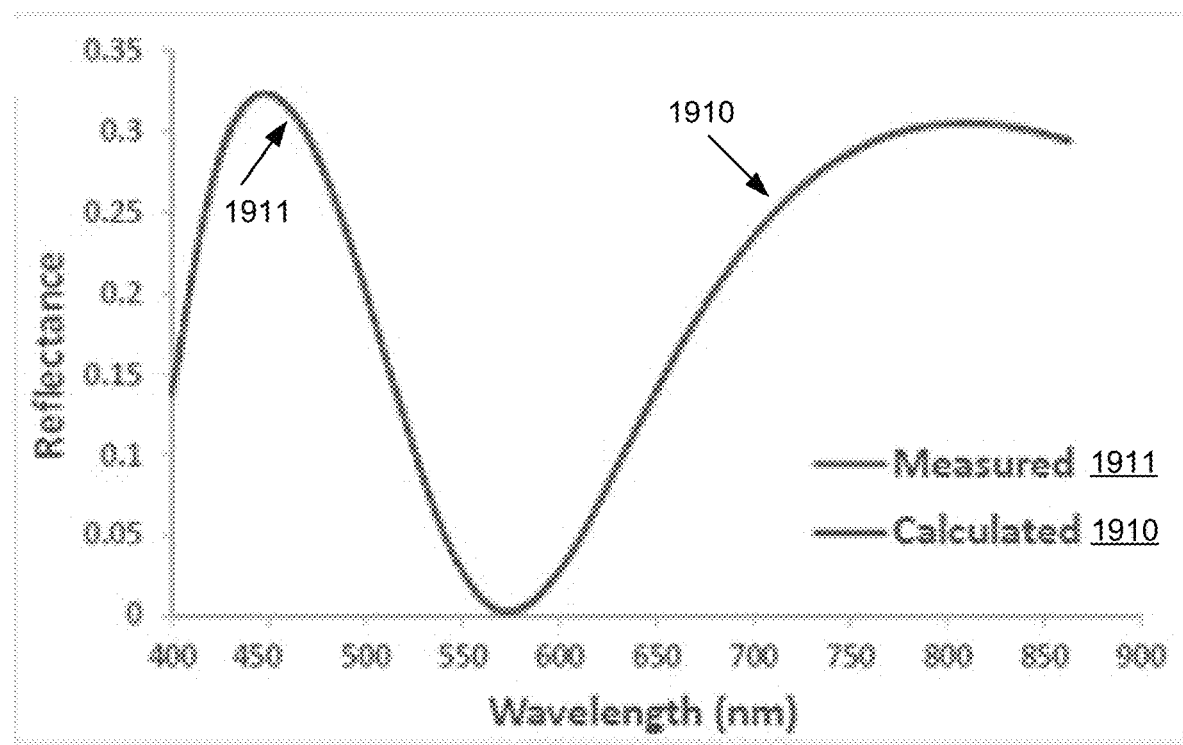
FIG. 19 shows a plot of an experimental and calculated reflectance of an example CEP device.

FIG. 19 shows a plot of an experimental and calculated reflectance of an example CEP device. The reflectance was measured on a controlled sample with blanket deposition of the three layers of material as in active device region. Using a Filmetrics system, the reflectance of the sample under different wavelengths can be obtained. Filmetrics system also simulated the reflectance with the material and structure parameters entered. The measured (plot 1911) and the calculated curves (plot 1912) matched very well, as shown in FIG. 19, which gives 17% reflection at 405 nm. This reflectivity can then be used to find the intrinsic responsivity of device.

Figure 20:
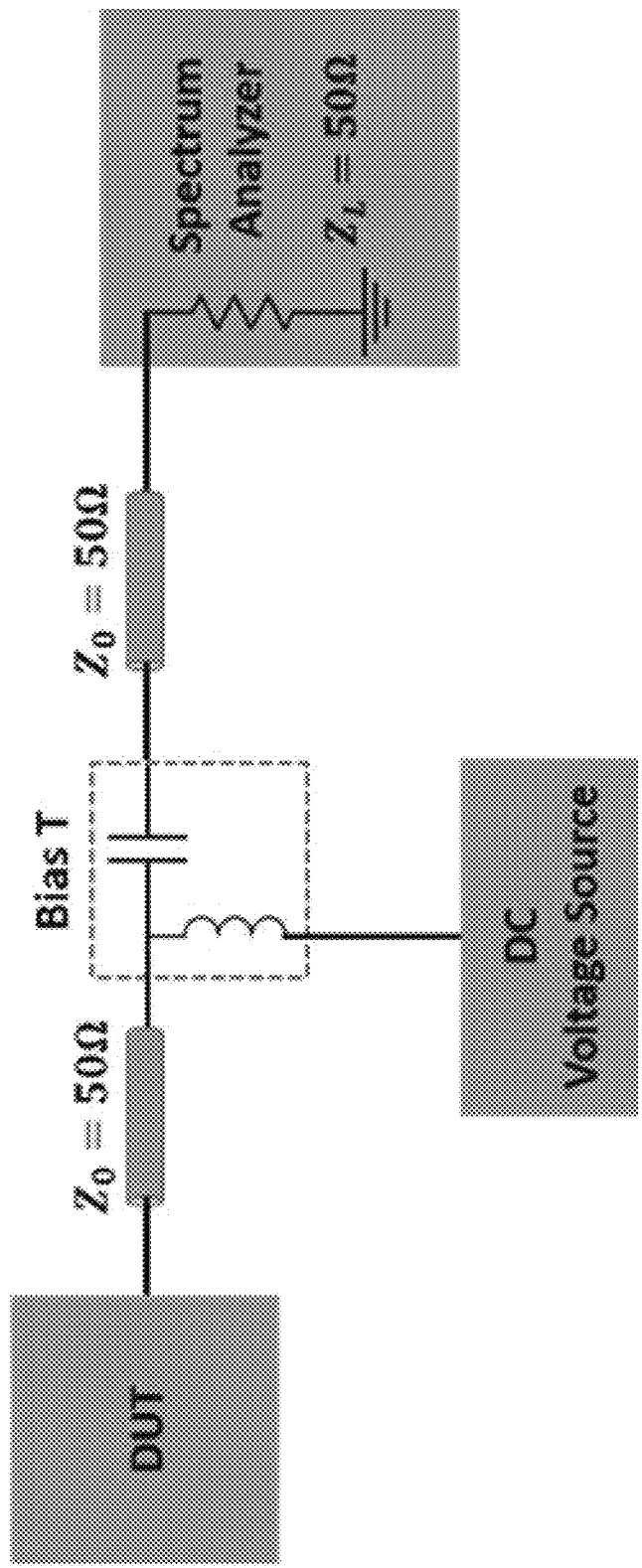
FIG. 20 shows a schematic circuit diagram for the high-speed measurement of the responsivity of an example CEP device.

FIG. 20 shows a schematic circuit diagram for the high-speed measurement of the responsivity of an example CEP device. For high speed measurement, a transmission line model was applied and the effects of reflections, signal attenuation, and cable length are taken into account. A high speed (e.g., up to 40 GHz) GSG probe was used to make device contacts, like that shown in FIG. 14B. All cables in the setup are high-frequency SMA cables. A bias-tee circuit is used to decouple the signal output from DUT into DC an AC components. The DC part of the circuit is still connected to the source meter to supply reverse bias. The AC component of the signal is measured by a spectrum analyzer which has an internal current preamplifier with an input impedance of 50Ω.

Excess Noise Factor Measurement and Calculation

In the example implementations, as the device noise level is under the measurement system noise floor, an external LNA was used to amplify the noise. A 50Ω resistor is connected in shunt to match the output impedance of the device. Assuming shot noise is dominant and dark current experiences the same amount of gain as photocurrent, we have, $$\sigma_s^2 = 2qG^2 F_A (RP_{in} + I_d) \Delta f = 2qG^2 F_A (I_{ph0} + I_d) \Delta f$$

$$\sigma_d^2 = \sigma_s^2 (P_{in}=0) = 2qG^2 F_A I_d \Delta f$$

where:
$F_A$: Excess noise factor;
$I_{ph0}$: Primary photo-current;
$I_d$: Primary dark current without amplification;
$\sigma_s^2$: Noise power in light-on condition;
$\sigma_d^2$: Noise power in dark condition.

The implementations included measurements of noise under light on and dark conditions, and the difference was taken:

$$\sigma_s^2 - \sigma_d^2 = 2qG^2 I_{ph0} F_A \Delta f = 2qG I_{ph} F_A \Delta f \quad (3)$$

$$F_A = \frac{\sigma_s^2 - \sigma_d^2}{2qG I_{ph} \Delta f}$$

The relationship of $I_{ph} = G I_{phO}$ was used to obtain Equation (3).

The spectrum analyzer measures, however, the Noise Power Spectrum Density (NPSD) of the amplified device noise with some cable loss and added noise by the LNA. For example, the following are denoted as:

$NPSD_s$: Measured Noise Power Spectrum Density in light-on condition;
$NPSD_d$: Measured Noise Power Spectrum Density in dark condition;
$N_a$: Added noise from the Low Noise Amplifier;
$G_{LNA}$: Power gain of the Low Noise Amplifier;
$G_{cable}$: Power "gain" (loss) due to the cable and bias tee frequency response.

The power loss by the 50Ω in-shunt resistor was also considered.

Considering the DUT as a current source and the input/output impedance of the LNA is also 50Ω=$R_L$, therefore, the reading from the spectrum analyzer can be presented as, $$NPSD_s = \frac{\sigma_s^2 \cdot G_{cable} \cdot R_L \cdot G_{LNA} + N_a}{\Delta f}$$

$$NPSD_d = \frac{\sigma_d^2 \cdot G_{cable} \cdot R_L \cdot G_{LNA} + N_a}{\Delta f}$$

Using the difference, it is shown that the added noise from the LNA is canceled:

$$NPSD_s - NPSD_d = (\sigma_s^2 - \sigma_d^2) G_{cable} \cdot R_L \cdot G_{LNA} + N_a/\Delta f$$

$$\frac{NPSD_s - NPSD_d}{G_{LNA} G_{cable} R_L} = \frac{\sigma_s^2 - \sigma_d^2}{\Delta f}$$

The excess noise factor ($F_A$) from the measured NPSD can be calculated by substituting into Equation (3), $$F_A = \frac{NPSD_s - NPSD_d}{G_{LNA} G_{cable} R_L} \cdot \frac{1}{2qG I_{ph}}$$

Figure 21:
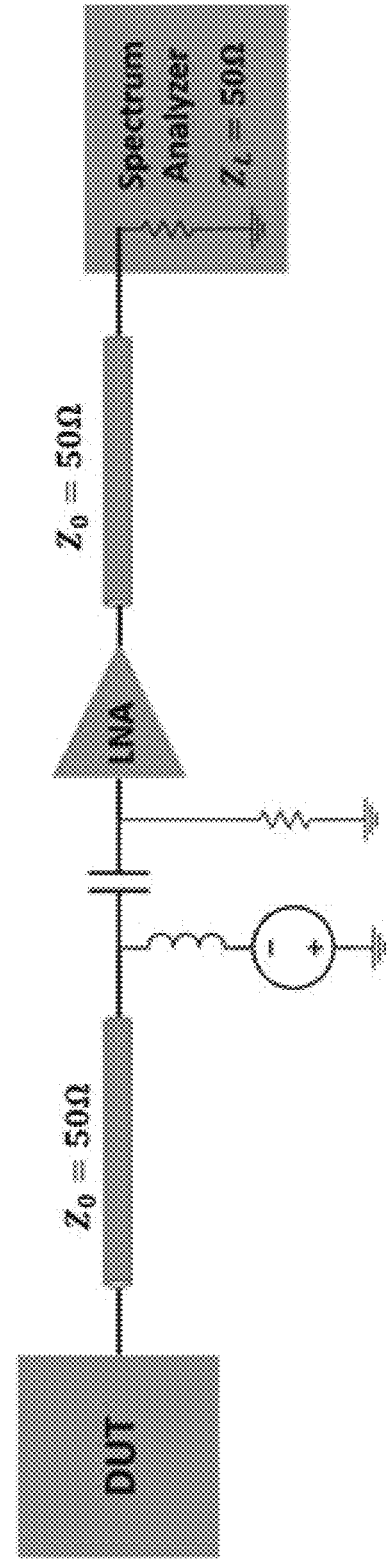
FIG. 21 shows a schematic circuit diagram for the excess noise factor measurement and calculation for an example device.

FIG. 21 shows a schematic circuit diagram for the noise measurement.

Figure 22:
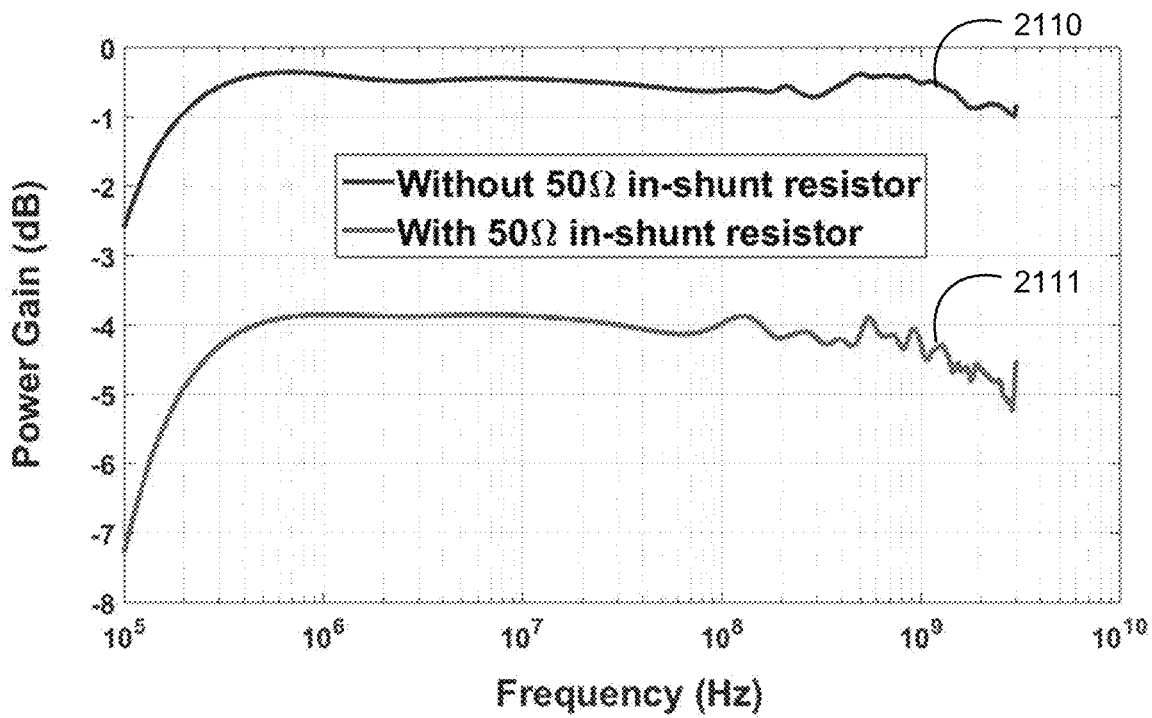
FIG. 22 shows exemplary plots demonstrating the power gain of the device of FIGS. 1A-1D with and without 5Ω in-shunt resistor.

FIG. 22 shows a plot of the measured power loss.

Power loss due to the bias tee and cable can be characterized by measuring the scattering parameter S21 with the network analyzer. The excess noise factor reported in our paper was measured at 70 MHz. The power loss without 5Ω in-shut resistor is show as plot 2110 and with 5Ω in-shunt resistor is shown in plot 2111.

EXAMPLES

In some embodiments in accordance with the present technology (example A1), a device for amplifying signals of light-induced photocurrent includes an anode connected to a positive terminal of a voltage source; a disordered material layer coupled to the anode, in which the disordered material layer is structured to have a thickness of 100 nm or less; and a cathode coupled to the disordered material layer and connected to a negative terminal of the voltage source, in which the device is operable to amplify photoexcited carriers based on photon absorption to produce an external quantum efficiency of the device that is at least 100%.

Example A2 includes the device of example A1, in which the disordered material layer is structured to have a density of localized energy states between the bandgap or at the bandtails of the conduction band and the valence band of at least $1 \times 10^{18}$ cm$^{-3}$.

Example A3 includes the device of example A1, in which the electrical signal is amplified by a cycling excitation process (CEP) amplification mechanism to a gain of at least 10.

Example A4 includes the device of example A1, in which the device is operable to convert photons absorbed by the device to an electrical signal amplified across the disordered material layer by the amplification mechanism to produce the external quantum efficiency of the device that is at least 100%.

Example A5 includes the device of example A1, in which the voltage source is configured to supply a bias potential of 10 V or less between the anode and the cathode.

Example A6 includes the device of example A1, further including a light absorption layer coupled to the disordered material layer to increase absorption of light incident on the device to a sufficient amount of photons that induces the amplification mechanism, in which coupling of the light absorption layer and disordered material layer align a bandgap overlap between the light absorption layer and the disordered material layer to provide quantum efficiency of charge carriers transport between the light absorption layer and the disordered material layer.

Example A7 includes the device of example A6, in which the light absorption layer is structured between the disordered material and the cathode.

Example A8 includes the device of example A7, in which the coupling of the light absorption layer and disordered material is structured to have a difference in an electron affinity ($\Delta E_a$) between them that is greater than zero and a difference in a sum of the electron affinity and bandgap ($\Delta E_c$) between them that is greater than zero.

Example A9 includes the device of example A6, in which the light absorption layer is structured between the disordered material and the anode.

Example A10 includes the device of example A9, in which the coupling of the light absorption layer and disordered material is structured to have a difference in an electron affinity ($\Delta E_a$) between them that is less than zero and a difference in a sum of the electron affinity and bandgap ($\Delta E_c$) between them that is less than zero.

Example A11 includes the device of example A6, further including one or both of an n-type semiconductor material coupled between the light absorption layer and the anode; and a p-type semiconductor material coupled between the light absorption layer and the cathode.

Example A1 includes the device of example A1, further including one or both of an n-type semiconductor material coupled between the disordered material layer and the anode; and a p-type semiconductor material coupled between the disordered material layer and the cathode.

Example A13 includes the device of example A1, in which the disordered material includes an amorphous semiconductor material.

Example A14 includes the device of example A13, in which the amorphous semiconductor material includes an intrinsically disordered material or material that has been modified to introduce disorder.

Example A15 includes the device of example A14, in which the amorphous semiconductor material includes a hydrogenated amorphous Silicon (a-Si:H).

Example A16 includes the device of example A13, in which the amorphous semiconductor material includes amorphous Si (a-Si), amorphous SiGe (a-SiGe), amorphous GaAs (a-GaAs), amorphous InP (a-InP), amorphous GaN (a-GaN), amorphous AN (a-AlN), amorphous BN (a-BN), or amorphous SiC (a-SiC).

Example A17 includes the device of example A13, in which the amorphous semiconductor material is doped with carbon (C) or nitrogen (N).

Example A18 includes the device of example A1, in which the disordered material includes a polymer material.

Example A19 includes the device of example A18, in which the polymer material includes P3HT Poly(3-hexyl-thiophene-2,5-diyl), PDBT, polyphenylene vinylene (PPV), PCE, PDPP-DTT, PTAA, Alq3, phenyl-$C_{61}$-butyric acid methyl ester (PCBM), pentacene, triphenyl diamin (TPD) derivatives of carbazole, or phthalocyanine.

Example A20 includes the device of example A1, in which the disordered material layer has a thickness in a range of 30 nm to 60 nm.

Example A21 includes the device of example A1, in which the device is operable to detect a single photon and produce a corresponding electrical signal.

Example A22 includes the device of example A1, in which the device is operable to reduce noise associated with dark current to 30 nA or less at a 3 V reverse bias.

In some embodiments in accordance with the present technology (example A23), a method for amplifying signals of light-induced photocurrent includes receiving light on a surface of a device structured to include an anode connected to a positive terminal of a voltage source, a disordered material having a thickness of 100 nm or less coupled to the anode, and a cathode coupled to the disordered material and connected to a negative terminal of the voltage source; converting the absorbed photons to an electrical signal and amplifying photoexcited carriers to produce an electrical current flux that is greater than an incoming photon flux on the device, in which the electrical signal is presented at an electrode on device; and conducting the electrical signal to an electrical circuit.

Example A24 includes the method of example A23, in which the amplification is a cycling excitation process (CEP) amplification mechanism.

Example A25 includes the method of example A24, in which the CEP amplification mechanism includes creating an electron-hole pair based on an absorbed photon to cause primary holes to enter the disordered semiconductor material and to collect primary electrons at an anode electrode; initiating an Auger process based on the primary holes entering the disordered semiconductor material to excite a localized hole from a conduction bandtail state of the disordered semiconductor material to a valence band and leave a localized electron at the bandtail state; transferring the localized electron to the conduction band, in which the transferred electron gains kinetic energy traveling across the disordered semiconductor material to initiate an Auger process to excite another localized electron from a valence bandtail state of the disordered semiconductor material to a conduction band and leave a localized hole in the bandtail state; transferring the localized hole to the valence band, in which the transferred hole gains kinetic energy traveling across the disordered semiconductor material to initiate the Auger process to excite another localized electron from the valence bandtail to the conduction band, in which the transferring causes repetition of the CEP amplification mechanism; and collecting the primary holes and excited holes at a cathode electrode and the primary electrons and excited electrons at the anode electrode.

Example A26 includes the method of example A25, further including applying an electric field across the disordered material layer to energize the primary electrons and the primary holes.

Example A27 includes the method of example A26, in which the applied electric field includes a bias of 4 V or less.

Example A28 includes the method of example A25, in which the transferring is based on phonon absorption or field assisted tunneling.

Example A29 includes the method of example A24, in which the electrical signal is amplified by the CEP amplification mechanism to produce a gain of the device of at least 10.

In some embodiments in accordance with the present technology (example A30), a photodetector article for amplifying signals of light-induced photocurrent includes a disordered material including an amorphous semiconductor material or a polymer material that includes a dopant to convert photons to an electrical signal and amplify photo-excited carriers having their electron or hole mobility under 10 cm$^2$/V$^{-s}$ at an electric field 10 kV/cm below to produce an electrical current flux that is greater than an incoming photon flux on the device.

Example A31 includes the photodetector article of example A30, in which the photodetector article is operable to detect a single photon to produce the electrical signal.

Example A32 includes the photodetector article of example A30, in which the disordered material is structured to have a density of localized energy states between the bandgap or at the bandtails of the conduction band and valence band of at least $1 \times 10^{18}$ cm$^3$.

Example A33 includes the photodetector article of example A30, in which the dopant includes carbon (C) or nitrogen (N).

Example A34 includes the photodetector article of example A30, in which the dopant is doped at a concentration of 5% or less.

Example A35 includes the photodetector article of example A30, in which the disordered material includes a hydrogenated amorphous Silicon (a-Si:H).

Example A36 includes the photodetector article of example A30, in which the amorphous semiconductor material includes amorphous Si (a-Si), amorphous SiGe (a-SiGe), amorphous GaAs (a-GaAs), amorphous InP (a-InP), amorphous GaN (a-GaN), amorphous AN (a-AlN), amorphous BN (a-BN), or amorphous SiC (a-SiC).

Example A37 includes the photodetector article of example A30, in which the polymer material includes P3HT Poly(3-hexylthiophene-2,5-diyl), PDBT, polyphenylene vinylene (PPV), PCE, PDPP-DTT, PTAA, Alq3, phenyl-C$_{61}$-butyric acid methyl ester (PCBM), pentacene, triphenyl diamin (TPD) derivatives of carbazole, or phthalocyanine.

Example A38 includes the photodetector article of example A30, in which the disordered material is structured to include a first interface surface to connect to an anode and a second interface surface to connect to a cathode.

In some embodiments in accordance with the present technology (example A39), a device for amplifying signals of light-induced photocurrent includes an oxide electrode that is transparent or at least translucent; disordered material coupled to the oxide electrode at a first side, in which the disordered material is structured to have a thickness of 100 nm or less; an n-type material layer coupled to a second side opposite the first side of the disordered material, in which the oxide electrode is operable as a cathode and the n-type material is operable as an anode when the oxide electrode and the n-type material are electrically coupled to a voltage source; and a substrate coupled to the n-type material layer, in which the device is operable to convert photons absorbed at the disordered material to an electrical signal amplified across the disordered material by an amplification mechanism to produce an external quantum efficiency of the device that is at least 100%.

Example A40 includes the device of example A39, in which the disordered material is structured to have a density of localized energy states between the bandgap or at the bandtails of the conduction band and the valence band of at least $1 \times 10^{18}$ cm$^{-3}$.

Example A41 includes the device of example A39, in which the electrical signal is amplified by a cycling excitation process (CEP) amplification mechanism to a gain of at least 10.

Example A42 includes the device of example A39, in which the voltage source is configured to supply a bias potential of 4 V or less between the anode and the cathode, which can include a low voltage bias of at 4 V or less.

Example A43 includes the device of example A39, in which the substrate includes an n+-Silicon substrate, and the n-type material is structured to include an n$^+$-Silicon mesa layer over the n+-Silicon substrate.

Example A44 includes the device of example A43, further including a Ti/Au electrode coupled to the n+-Silicon substrate adjacent to the n+-Silicon mesa layer.

Example A45 includes the device of example A39, in which the oxide electrode includes indium tin oxide (ITO).

Example A46 includes the device of example A39, in which the disordered material includes hydrogenated amorphous silicon (a-Si:H).

Example A47 includes the device of example A39, further includes a light absorption layer coupled to the disordered material and the oxide electrode to increase light absorption by the device to a sufficient amount of photons to induce the amplification mechanism, in which coupling of the light absorption layer and disordered material align a bandgap overlap between the light absorption layer and the disordered material to provide quantum efficiency of charge carriers transport between the light absorption layer and the second layer.

Example A48 includes the device of example A47, in which the coupling of the light absorption layer and disordered material is structured to have a difference in an electron affinity ($\Delta E_a$) between them that is greater than zero and a difference in a sum of the electron affinity and bandgap ($\Delta E_c$) between them that is greater than zero.

In some embodiments in accordance with the present technology (example B1), a device for amplifying signals of light-induced photocurrent using cycling excitation process includes a first layer including an n-type semiconductor material connected to an anode terminal of a voltage source; a second layer including a disordered material coupled to the n-type semiconductor material, in which the disordered material is structured to have an energy density of localized energy states between the bandgap or at the bandtails of the conduction band and valence band of at least $1 \times 10^{18}$ cm$^{-3}$; and a third layer including a p-type semiconductor material coupled to the disordered material of the second layer and connected to a cathode terminal of the voltage source, in which the device is operable to convert photons absorbed in one of the first layer or the third layer to an electrical signal amplified across the second layer by a cycling excitation process (CEP) amplification mechanism.

Example B2 includes the device of example B1, further including a light absorption layer coupled to the second layer that increases light absorption by the device to a sufficient amount of photons to induce the CEP amplification mechanism, in which coupling of the light absorption layer and disordered material align a bandgap overlap between the light absorption layer and the disordered material to provide quantum efficiency of charge carriers transport between the light absorption layer and the second layer.

Example B3 includes the device of example B2, in which the light absorption layer is structured between the disordered material and the p-type semiconductor layer.

Example B4 includes the device of example B3, in which the coupling of the light absorption layer and disordered material is structured to have a difference in an electron affinity ($\Delta E_a$) between them that is greater than zero and a difference in a sum of the electron affinity and bandgap ($\Delta E_c$) between them that is greater than zero.

Example B5 includes the device of example B2, in which the light absorption layer is structured between the disordered material and the n-type semiconductor layer.

Example B6 includes the device of example B5, in which the coupling of the light absorption layer and disordered material is structured to have a difference in an electron affinity ($\Delta E_a$) between them that is less than zero and a difference in a sum of the electron affinity and bandgap ($\Delta E_c$) between them that is less than zero.

Example B7 includes the device of example B1, in which the disordered material includes an amorphous semiconductor material.

Example B8 includes the device of example B7, in which the amorphous semiconductor material includes an intrinsically disordered material or material that has been modified to introduce disorder.

Example B9 includes the device of example B8, in which the amorphous semiconductor material includes a hydrogenated amorphous Silicon (a-Si:H).

Example B10 includes the device of example B7, in which the amorphous semiconductor material includes amorphous Si (a-Si), amorphous SiGe (a-SiGe), amorphous GaAs (a-GaAs), amorphous InP (a-InP), amorphous GaN (a-GaN), amorphous AN (a-AlN), amorphous BN (a-BN), or amorphous SiC (a-SiC).

Example B11 includes the device of example B7, in which the amorphous semiconductor material is doped with carbon (C) or nitrogen (N).

Example B12 includes the device of example B1, in which the disordered material includes an amorphous polymer material.

Example B13 includes the device of example B12, in which the amorphous polymer material includes P3HT Poly(3-hexylthiophene-2,5-diyl), PDBT, polyphenylene vinylene (PPV), PCE, PDPP-DTT, PTAA, Alq3, phenyl-C61-butyric acid methyl ester (PCBM), pentacene, triphenyl diamin (TPD) derivatives of carbazole, or phthalocyanine.

Example B14 includes the device of example B1, in which the second layer has a thickness less than 100 nm.

Example B15 includes the device of example B1, in which the second layer has a thickness in a range of 30 nm to 60 nm.

Example B16 includes the device of example B1, in which the disordered material is operable to absorb incident light as a light absorbing layer.

Example B17 includes the device of example B1, in which the device is operable to detect a single photon and produce a corresponding electrical signal.

Example B18 includes the device of example B1, in which the device is operable to reduce noise associated with dark current to 30 nA or less at a 3 V reverse bias.

In some embodiments in accordance with the present technology (example B19), a method for amplifying signals of light-induced photocurrent using cycling excitation process includes receiving light on a surface of a device structured to include an n-type semiconductor material connected to an anode terminal of a voltage source, a disordered material coupled to the n-type semiconductor material, having an energy density of localized energy states between the bandgap or at the bandtails of the conduction band and valence band of at least $1\times10^{18}$ cm$^3$, and a p-type semiconductor material coupled to the disordered material, the receiving including absorbing photons of the light in one of the n-type semiconductor material or the p-type semiconductor material; converting the absorbed photons to an electrical signal amplified across the disordered material by a cycling excitation process (CEP) amplification mechanism, in which the electrical signal is presented at an electrode on device; and conducting the electrical signal to an electrical circuit.

Example B20 includes the method of example B19, in which the CEP amplification mechanism includes: creating an electron-hole pair based on an absorbed photon to cause primary holes to enter the disordered material and to collect primary electrons at an anode electrode; initiating an Auger process based on the primary holes entering the disordered material to excite a localized hole from a conduction bandtail state of the disordered material to a valence band and leave a localized electron at the bandtail state; transferring the localized electron to the conduction band, in which the transferred electron gains kinetic energy traveling across the disordered material to initiate an Auger process to excite another localized electron from a valence bandtail state of the disordered material to a conduction band and leave a localized hole in the bandtail state; transferring the localized hole to the valence band, in which the transferred hole gains kinetic energy traveling across the disordered material to initiate the Auger process to excite another localized electron from the valence bandtail to the conduction band, in which the transferring causes repetition of the CEP amplification mechanism; and collecting the primary holes and excited holes at a cathode electrode and the primary electrons and excited electrons at the anode electrode.

Example B21 includes the method of example B20, further including applying an electric field across the disordered material layer to energize the primary electrons and the primary holes.

Example B22 includes the method of example B21, in which the applied electric field includes a bias of 4 V or less.

Example B23 includes the method of example B20, in which the transferring is based on phonon absorption or field assisted tunneling.

Example B24 includes the method of example B19, in which the electrical signal is amplified by the CEP amplification mechanism to a gain of at least 1,000.

In some embodiments in accordance with the present technology (example B25), a photodetector material for amplifying signals of light-induced photocurrent using cycling excitation process (CEP) includes a n-type semiconductor layer; a disordered material layer coupled to the n-type semiconductor layer, in which the disordered material layer is structured to have an energy density of localized energy states between the bandgap or at the bandtails of the conduction band and valence band of at least $1\times10^{18}$ cm$^{-3}$; and a p-type semiconductor layer coupled to the disordered material layer.

Example B26 includes the photodetector material of example B25, in which the disordered material layer includes an amorphous semiconductor material.

Example B27 includes the photodetector material of example B26, in which the amorphous semiconductor material includes an intrinsically disordered material or material that has been modified to introduce disorder.

Example B28 includes the photodetector material of example B27, in which the amorphous semiconductor material includes a hydrogenated amorphous Silicon (a-Si:H).

Example B29 includes the photodetector material of example B26, in which the amorphous semiconductor material includes amorphous Si (a-Si), amorphous SiGe (a-SiGe), amorphous GaAs (a-GaAs), amorphous InP (a-InP), amorphous GaN (a-GaN), amorphous AN (a-AlN), amorphous BN (a-BN), or amorphous SiC (a-SiC).

Example B30 includes the photodetector material of example B26, in which the amorphous semiconductor material is doped with carbon (C) or nitrogen (N).

Example B31 includes the photodetector material of example B25, in which the disordered material layer includes an amorphous polymer material.

Example B32 includes the photodetector material of example B31, in which the amorphous polymer material includes P3HT Poly(3-hexylthiophene-2,5-diyl), PDBT, polyphenylene vinylene (PPV), PCE, PDPP-DTT, PTAA, Alq3, phenyl-C61-butyric acid methyl ester (PCBM), pentacene, triphenyl diamin (TPD) derivatives of carbazole, or phthalocyanine.

Example B33 includes the photodetector material of example B25, in which the disordered material layer has a thickness less than 100 nm.

Example B34 includes the photodetector material of example B25, in which the disordered material layer has a thickness in a range of 30 nm to 60 nm.

In some embodiments in accordance with the present technology (example B35), a device for amplifying signals of light-induced photocurrent using cycling excitation process includes an electrode including indium tin oxide (ITO); a disordered material coupled to the ITO electrode at a first side, in which the disordered material is structured to have an energy density of localized energy states between the bandgap or at the bandtails of the conduction band and valence band of at least $1 \times 10^{18}$ cm$^{-3}$; an n-type material layer coupled to a second side opposite the first side of the disordered material; and a substrate coupled to the n-type material layer, in which the device is operable to convert photons absorbed at the n-type material layer to an electrical signal amplified across the second layer by a cycling excitation process (CEP) amplification mechanism.

Example B36 includes the device of example B35, in which the n-type material layer includes an n$^+$-Silicon MESA layer, and the substrate includes an n+-Silicon substrate.

Example B37 includes the device of example B36, further including a Ti/Au electrode coupled to the n+-silicon substrate.

Example B38 includes the photodetector material of example B35, in which the disordered material includes hydrogenated amorphous silicon (a-Si:H).

Example B39 includes the photodetector material of example B35, in which the ITO electrode is configured as a cathode and the n-type material layer is configured as an anode when the device is connected to a voltage source.

Example B40 includes the photodetector material of example B35, further including a light absorption layer coupled to the disordered material and the ITO electrode to increase light absorption by the device to a sufficient amount of photons to induce the CEP amplification mechanism, in which coupling of the light absorption layer and disordered material align a bandgap overlap between the light absorption layer and the disordered material to provide quantum efficiency of charge carriers transport between the light absorption layer and the second layer.

Example B41 includes the photodetector material of example B40, in which the coupling of the light absorption layer and disordered material is structured to have a difference in an electron affinity ($\Delta E_a$) between them that is greater than zero and a difference in a sum of the electron affinity and bandgap ($\Delta E_c$) between them that is greater than zero.

In some embodiments in accordance with the present technology (example B42), a method for producing disordered material for a photodetector device includes modifying a crystalline semiconductor material (e.g., silicon) by heavily-doping and heavily compensating a p/n junction region of the crystalline semiconductor material to form a quasi-disordered material, in which the doping impurities are introduced to the crystalline semiconductor material during growth of epitaxial materials. In implementations of silicon, for example, the heavily doped and heavily compensated Si p/n junction is modified by introducing a large number of boron atoms and a slightly lower number of phosphorous atoms to form a partially compensated p-layer, and then introducing a large number of phosphorous atoms and a slightly lower number of boron atoms to form a partially compensated n-layer. The two layers, which are created to have a thickness in the tens of nanometers regime (e.g., 50 nm or less), form a partially compensated Si p/n junction that can produce the CEP effect.

While this patent document contains specific example embodiments, these should not be construed as limitations for the materials that can satisfy the necessary requirements for the implementation of a CEP device, but rather Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A device for amplifying signals of light-induced photocurrent, comprising:
   an anode in electrical contact with a positive terminal of a voltage source;
   a cathode in electrical contact with a negative terminal of the voltage source;
   a disordered material layer coupled to the cathode, wherein the disordered material layer is structured to have a thickness of 100 nm or less;
   and a light absorption layer coupled to the disordered material layer and coupled to the anode, wherein a first electron affinity of the light absorption layer is lower than a second electron affinity of the disordered material layer, and a first sum of the first electron affinity and a first bandgap of the light absorption layer is lower than a second sum of the second electron affinity and a second bandgap of the disordered material layer, the light absorption layer absorbs light incident on the device and causes amplification via a cycling excitation process (CEP) amplification mechanism, wherein the light absorption layer and the disordered material layer are coupled to have a bandgap alignment between the light absorption layer and the disordered material layer that causes an external quantum efficiency of a charge carrier transport between the light absorption layer and the disordered material layer of at least 100%.

2. The device of claim 1, wherein the disordered material layer is structured to have a density of localized energy states between the second bandgap or at bandtails of a conduction band and a valence band of at least $1\times10^{18}$ cm$^{-3}$.

3. The device of claim 1, wherein the CEP amplification mechanism amplifies an electrical signal converted from photons absorbed by the device with a gain of at least 10.

4. The device of claim 1, wherein the device is operable to convert photons absorbed by the device to an electrical signal amplified across the disordered material layer by the CEP amplification mechanism to produce the external quantum efficiency of charge carriers between the light absorption layer and the disordered material layer of at least 100%.

5. The device of claim 1, wherein the voltage source is configured to supply a bias potential of 10 V or less between the anode and the cathode.

6. The device of claim 1, wherein the disordered material includes an amorphous semiconductor material.

7. The device of claim 6, wherein the amorphous semiconductor material includes an intrinsically disordered material or material that has been modified to introduce disorder.

8. The device of claim 7, wherein the amorphous semiconductor material includes a hydrogenated amorphous Silicon (a-Si:H).

9. The device of claim 6, wherein the amorphous semiconductor material includes amorphous Si (a-Si), amorphous SiGe (a-SiGe), amorphous GaAs (a-GaAs), amorphous InP (a-InP), amorphous GaN (a-GaN), amorphous MN (a-AlN), amorphous BN (a-BN), or amorphous SiC (a-SiC).

10. The device of claim 6, wherein the amorphous semiconductor material is further doped with nitrogen (N).

11. The device of claim 1, wherein the disordered material includes a polymer material.

12. The device of claim 11, wherein the polymer material includes P3HT Poly(3-hexylthiophene-2,5-diyl), PDBT, polyphenylene vinylene (PPV), PCE, PDPP-DTT, PTAA, Alq3, phenyl-C61-butyric acid methyl ester (PCBM), pentacene, triphenyl diamin (TPD) derivatives of carbazole, or phthalocyanine.

13. The device of claim 1, wherein the disordered material layer has a thickness in a range of 30 nm to 60 nm.

14. The device of claim 1, wherein the device is operable to detect a single photon and produce a corresponding electrical signal.

15. The device of claim 1, wherein the device is operable to reduce noise associated with dark current to 30 nA or less at a 3 V reverse bias.

16. The device of claim 1, wherein the disordered material layer includes a carbon-doped semiconductor layer, and the carbon-doped semiconductor layer includes a Carbon dopant having a percentage of the Carbon dopant in the disordered material layer that is more than 0% and less than 5%.

17. The device of claim 1, wherein the disordered material layer comprises Germanium.

18. The device of claim 1, wherein the disordered material comprises Silicon.

19. The device of claim 1, comprising a layer including Copper (I) Oxide ($Cu_2O$) or Nickel (II) Oxide (NiO).

20. The device of claim 1, wherein the disordered material layer is formed on a mesa structure.

21. The device of claim 1, wherein the voltage source is configured to supply a voltage bias potential of at least 4 V between the anode and the cathode to obtain a CEP gain.

22. A device, comprising:
an anode contact layer;
a cathode contact layer;
a disordered material layer coupled to the cathode contact layer; and
a light absorption layer coupled to the disordered material layer and coupled to the anode contact layer, wherein a first electron affinity of the light absorption layer is lower than a second electron affinity of the disordered material layer, and a first sum of the first electron affinity and a first bandgap of the light absorption layer is lower than a second sum of the second electron affinity and a second bandgap of the disordered material layer, the light absorption layer absorbs a light incident on the device and causes photoelectric signal amplification via a carrier multiplication process, wherein the first bandgap of the coupled light absorption layer is aligned with the second bandgap of the disordered material layer, wherein no additional intervening layers lie between any two of the anode contact layer, the cathode contact layer, the disordered material layer, and the light absorption layer.

23. The device of claim 22, wherein the bandgap aligned between the light absorption layer and the disordered material layer causes a transport of carriers between the light absorption layer and the disordered material layer.

24. The device of claim 23, wherein the carrier multiplication process includes a cycling excitation amplification (CEP) mechanism.

25. The device of claim 23, wherein the transport of carriers between the light absorption layer and the disordered material layer has an external quantum efficiency of at least 100%.

26. The device of claim 22, wherein the device amplifies a photocurrent induced by the light incident on the device.

27. The device of claim 22, wherein the disordered material layer includes a carbon-doped semiconductor layer, and wherein the carbon doped semiconductor enables a phonon-assisted excitation of localized carriers into a mobile band of the disordered material layer.

28. The device of claim 22, wherein the disordered material layer includes a carbon doped semiconductor layer, and wherein the carbon-doped semiconductor layer includes a Carbon dopant having a percentage of the Carbon dopant in the disordered material layer that is more than 0% and less than 5%.

29. The device of claim 22, wherein the disordered material layer comprises one or both of Germanium and Silicon.

* * * * *